United States Patent
Aben et al.

(10) Patent No.: US 9,977,340 B2
(45) Date of Patent: May 22, 2018

(54) METHOD AND APPARATUS FOR MEASURING A STRUCTURE ON A SUBSTRATE, COMPUTER PROGRAM PRODUCTS FOR IMPLEMENTING SUCH METHODS AND APPARATUS

(75) Inventors: Maria Johanna Hendrika Aben, Eindhoven (NL); Hugo Augustinus Joseph Cramer, Eindhoven (NL); Noelle Martina Wright, Eindhoven (NL); Ruben Alvarez Sanchez, Veldhoven (NL); Martijn Jaap Daniel Slob, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 1475 days.

(21) Appl. No.: 13/101,663

(22) Filed: May 5, 2011

(65) Prior Publication Data
US 2012/0123748 A1     May 17, 2012

Related U.S. Application Data
(60) Provisional application No. 61/351,527, filed on Jun. 4, 2010.

(51) Int. Cl.
    *G06G 7/62*        (2006.01)
    *G03F 7/20*        (2006.01)

(52) U.S. Cl.
CPC .......... *G03F 7/70633* (2013.01); *G03F 7/705* (2013.01); *G03F 7/70483* (2013.01); *G03F 7/70491* (2013.01); *G03F 7/70625* (2013.01)

(58) Field of Classification Search
None
See application file for complete search history.

(56) References Cited

U.S. PATENT DOCUMENTS

| | | |
|---|---|---|
| 6,609,086 B1 | 8/2003 | Bao et al. |
| 7,330,279 B2 | 2/2008 | Vuong et al. |

(Continued)

FOREIGN PATENT DOCUMENTS

| | | |
|---|---|---|
| CN | 100424711 C | 10/2008 |
| EP | 1 628 164 A2 | 2/2006 |

(Continued)

OTHER PUBLICATIONS

International Search Report directed to related International Application No. PCT/EP2011/056999, dated Sep. 27, 2011, from the European Patent Office; 4 pages.

(Continued)

*Primary Examiner* — Suzanne Lo
(74) *Attorney, Agent, or Firm* — Sterne, Kessler, Goldstein & Fox P.L.L.C.

(57) ABSTRACT

Diffraction models and scatterometry are used to reconstruct a model of a microscopic structure on a substrate. A plurality of candidate structures are defined, each represented by a plurality of parameters ($p_1$, $p_2$, etc.)). A plurality of model diffraction signals are calculated by simulating illumination of each of the candidate structures. The structure is reconstructed by fitting one or more of the model diffraction signals to a signal detected from the structure. In the generation of the candidate structures, a model recipe is used in which parameters are designated as either fixed or variable. Among the variable parameters, certain parameters are constrained to vary together in accordance with certain constraints, such as linear constraints. An optimized set of constraints, and therefore an optimized model recipe, is determined by reference to a user input designating one or more parameters of interest for a measurement, and by simulating the reconstruction process reconstruction. The optimized model recipe can be determined automatically by (Continued)

a parameter advisor process that simulates reconstruction of a set of reference structures, using a plurality of candidate model recipes. In the generation of the reference structures, restrictions can be applied to exclude unrealistic parameter combinations.

17 Claims, 11 Drawing Sheets

(56) References Cited

U.S. PATENT DOCUMENTS

| | | | |
|---|---|---|---|
| 7,460,237 B1 | 12/2008 | Cramer | |
| 7,522,293 B2 | 4/2009 | Wu et al. | |
| 7,523,076 B2 | 4/2009 | Drege et al. | |
| 8,739,082 B2 * | 5/2014 | Liu | G03F 1/144 716/52 |
| 2004/0017574 A1 | 1/2004 | Vuong et al. | |
| 2004/0017575 A1 * | 1/2004 | Balasubramanian et al. | 356/625 |
| 2004/0181768 A1 * | 9/2004 | Krukar | G03F 7/70625 716/51 |
| 2004/0267397 A1 | 12/2004 | Doddi et al. | |
| 2005/0209816 A1 | 9/2005 | Vuong et al. | |

FOREIGN PATENT DOCUMENTS

| | | |
|---|---|---|
| JP | 2005-534192 A | 11/2005 |
| JP | 2007-528985 A | 10/2007 |
| JP | 2008-530579 A | 8/2008 |
| JP | 2009-124101 A | 6/2009 |

OTHER PUBLICATIONS

International Preliminary Report on Patentability and Written Opinion of the International Searching Authority directed to related International Patent Application No. PCT/EP2011/056999, dated Dec. 4, 2012; 7 pages.

* cited by examiner

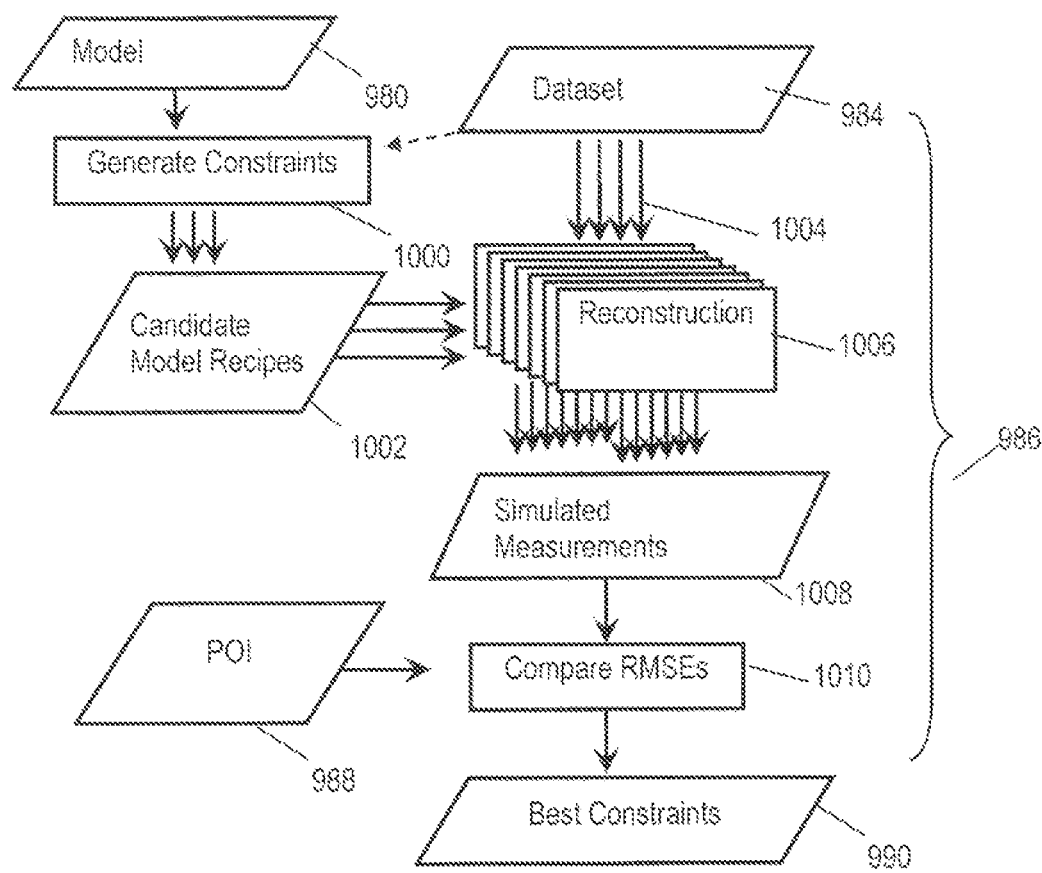
Fig. 12B
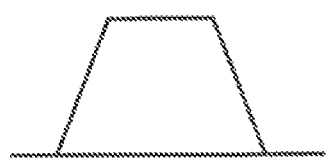
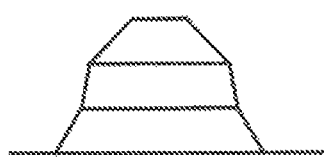
Fig. 13 (a)   Fig. 13 (b)
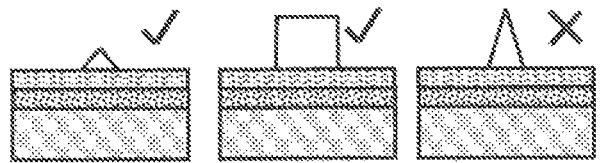
Fig. 14 (a)   Fig. 14(b)   Fig. 14(c)

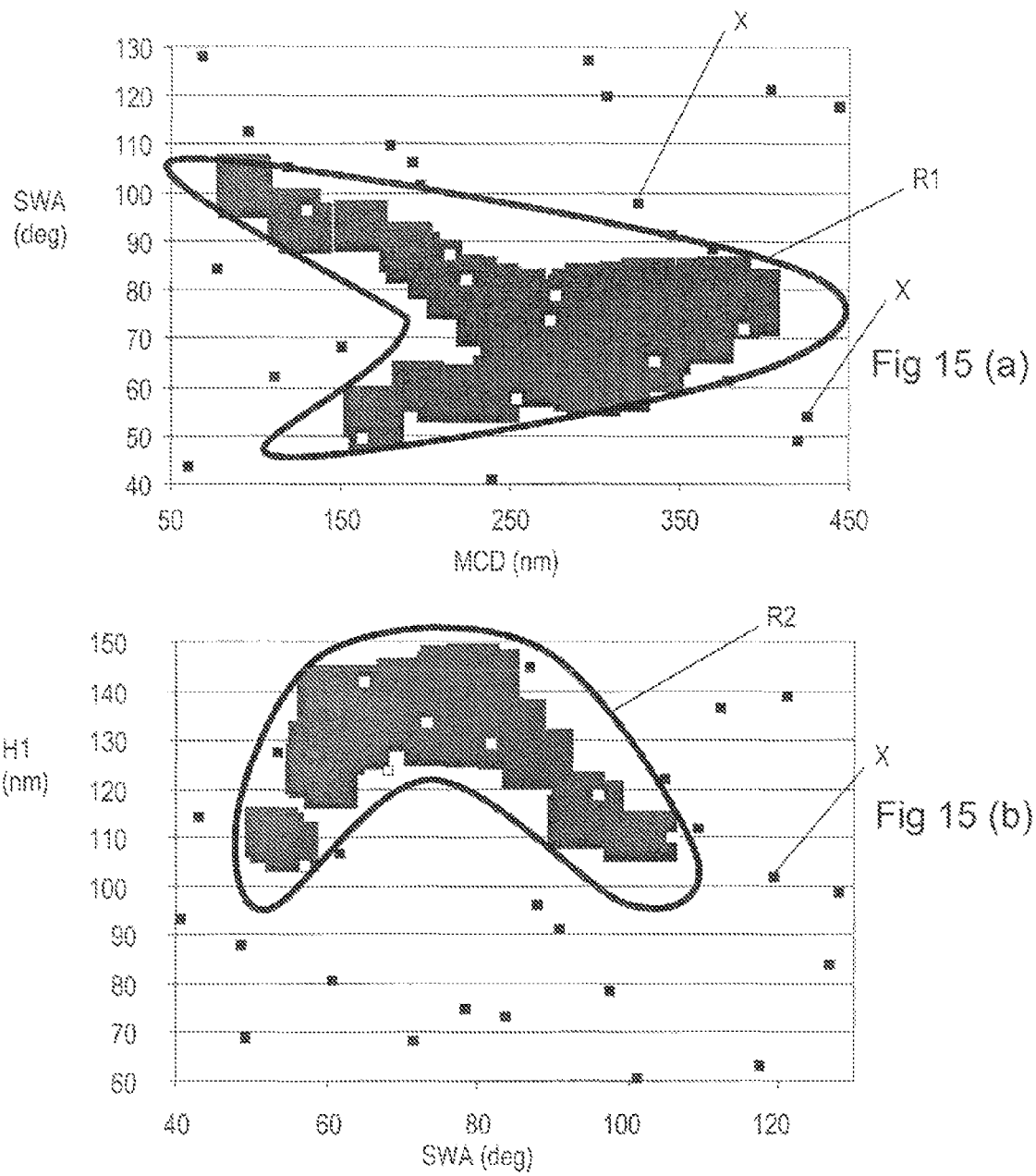

… (1)

METHOD AND APPARATUS FOR MEASURING A STRUCTURE ON A SUBSTRATE, COMPUTER PROGRAM PRODUCTS FOR IMPLEMENTING SUCH METHODS AND APPARATUS

CROSS REFERENCE TO RELATED APPLICATIONS

This applications claims benefit under 35 U.S.C. 119(e) to U.S. Provisional patent Application No. 61/351,527, filed, Jun. 4, 2010, which is incorporated by reference herein in its entirety.

BACKGROUND

Field of the Invention

The present invention relates to methods and apparatus for measuring a structure on a substrate. The invention can be applied for example in model based metrology of microscopic structures, for example to assess critical dimensions (CD) or overlay performance of a lithographic apparatus.

Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern be formed on an individual layer of the IC. This pattern can be transferred onto a target portion (e.g., comprising part of, one, or several dies) on a substrate (e.g., a silicon wafer).—Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters can include, for example, the overlay error between successive layers formed in or on the patterned substrate and critical linewidth of developed photosensitive resist. This measurement can be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

By comparing the properties of the beam before and after it has been reflected or scattered by the substrate, the properties of the substrate can be determined. This can be done, for example, by comparing data obtained from measurement of the reflected or scattered beam with model, e.g., simulated, diffraction signals calculated from a parameterized model. The calculated signals can be pre-calculated and stored in a library, the library representing a plurality of candidate substrate structures distributed in a parameter space of the parameterized model. Alternatively or in addition, parameters can be varied during an iterative search process, until a calculated diffraction signal matches the measured signal. In U.S. Pat. No. 7,522,293 to Wu et al., for example, these two techniques are described for example as 'library based' and 'regression based' processes, respectively.

In particular for complex structures, or structures including particular materials, the number of parameters required to model the scattered beam accurately is high. A 'model recipe' can be defined in which parameters are defined as either given, e.g., fixed, or variable, e.g., floating. For floating parameters, the permitted range of variation is defined, either in absolute terms or by reference to deviation from a nominal value. Each floating parameter in the recipe represents another degree of freedom in the model, and consequently another dimension in the multidimensional parameter space in which the best matching candidate structure is to be found. Even with a handful of parameters, the size of computational tasks quickly becomes very large, for example by raising the number of library samples unacceptably. It also raises the risk of falsely matching parameter sets that do not correspond to the measured substrate. Unfortunately, fixing a parameter to a value that is not identical to what is in the measured structure will distort the matching process so that inaccuracy arises in floating parameters, which can be the parameters of most interest. The recipe is therefore a delicate compromise between accuracy and practicality of computation.

SUMMARY

Therefore, what is needed is an effective system and method to provide better tools for measurement of structures by reconstruction methods of the type described above. In particular, an embodiment of the present invention enables better comprises to be reached, between the need for more variable parameters in the interests of accuracy, and the penalties that arise where a model has too many degrees of freedom. The inventors have recognized that the number of degrees of freedom in the model can be reduced by imposing relationships between floating parameters, not only by fixing parameters to a nominal value.

In an embodiment of the present invention, there is provided a method of measuring at least one parameter of a structure on a substrate, the method including the steps of (a) defining a mathematical model of the structure, in which shape and material properties are represented by a plurality of parameters which are variable with a plurality of degrees of freedom, (b) defining a model recipe by designating which of the parameters will be treated as fixed parameters and which of the parameters will be treated as variable parameters, (c) illuminating the structure with one or more beams of radiation and detecting a signal arising from interaction between the radiation and the structure, (d) generating a plurality of candidate model structures by reference to the model recipe, each candidate structure differing from the others in one or more of the variable parameters, (e) calculating a plurality of model signals by simulating interaction between the radiation and each of the candidate structures, (f) comparing the detected signal with at least some of the model signals, and (g) on the basis of the results of comparing in step (f), identifying a best matching model signal and reporting a measurement of one or more parameters of the structure based on the parameters of the candidate structure corresponding to the best matching model signal, wherein the model recipe generated in step (b) further comprises at least one constraint defining a relationship among a subset of the variable parameters so as to reduce the number of degrees of freedom in the model without treating the parameters of the subset as fixed parameters, and wherein in step (d) the constraint is applied such that the subset of parameters are constrained to vary together in accordance with the constraint, when generating the candidate structures.

An embodiment of the present invention allows degrees of freedom to be reduced without the compromising accuracy of reconstruction to the same degree as known techniques. It is noted that models in known systems typically have more variable parameters than there are degrees of freedom, due to the existence of natural constraints. For example, it is common for two features in a modeled structure to have their own parameters of shape and material. Though these parameters are separately named in the model, they will naturally be constrained to be equal, if the features in question are formed in the same material layer, by the same process steps. The invention is concerned with identifying and applying constraints additional to these natural constraints, with the aim to reduce the degrees of freedom below what are implied by the model itself.

An embodiment of the present invention further provides a method of generating a model recipe for use in a measurement method as set forth above, the method comprising the steps of (b1) providing a reference collection of model structures and respective model signals, the reference collection being generated with more degrees of freedom than are desired for the model recipe, (b2) generating a plurality of candidate model recipes, each candidate model recipe comprising a different set of one or more constraints, each constraint reducing the number of degrees of freedom in the model by defining relationship among a subset of the variable parameters so as to reduce the number of degrees of freedom in the model without treating the parameters of the subset as fixed parameters, (b3) performing the steps (c) to (g) of a measurement method, using each candidate model recipe, substituting a plurality of model signals from the reference collection in place of the detected signal, (b4) selecting a best model recipe by comparing measured parameter values obtained using each candidate model recipe with the known parameter values of the model structures corresponding to the model signals used in step (b3).

An embodiment of the present invention further provides an inspection apparatus for measuring at least one parameter of a structure on a substrate, the apparatus including an illumination system for illuminating the structure with one or more beams of radiation, a detection system for detecting a signal arising from interaction between the radiation and the structure, and a processor for comparing the detected signal with a plurality of model signals to identify a best matching model signal, wherein the processor is arranged to generate each of the model signals by reference to a respective candidate structure whose shape and material properties are represented by a plurality of parameters in a mathematical model, each candidate structure differing from the others in one or more of the parameters, wherein the processor is arranged to generate each of the candidate structures by reference to a model recipe designating which of the parameters will be treated as fixed parameters and which of the parameters will be treated as variable parameters, and wherein the model recipe further comprises at least one constraint defining a relationship among a subset of the variable parameters, and wherein the processor is arranged to apply the constraint in the generation of the candidate model structures such that the subset of parameters are constrained to vary together in accordance with the constraint, thereby to reduce the number of degrees of freedom in the model without treating the parameters of the subset as fixed parameters.

An embodiment of the present invention further provides certain computer program products for causing a processor to implement such methods and apparatuses, and/or to generate model recipes for use in such apparatuses and methods.

Further embodiments, features, and advantages of the present invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate the present invention, and, together with the description, further serve to explain the principles of the invention and to enable a person skilled in the relevant art(s) to make and use the invention.

FIGS. 12A and 12B illustrate a method of obtaining an optimized model recipe including linear constraints, according to an embodiment of the present invention.

FIG. 13 shows simple (a) and complex (b) models of a feature in a target structure, according to an embodiment of the present invention.

FIG. 14 compares (a), (b) realistic and (c) unrealistic or unlikely variations of the structure of FIG. 7, according to an embodiment of the present invention.

FIGS. 15(a) and 15(b) and 16(a) and 16(b) illustrate the distribution of realistic and unrealistic parameter sets, with regard to certain pairs of parameters of the example structure, and the application of realistic sampling in the processes of FIGS. 5, 6 and/or 12, according to an embodiment of the present invention.

Figure 1:
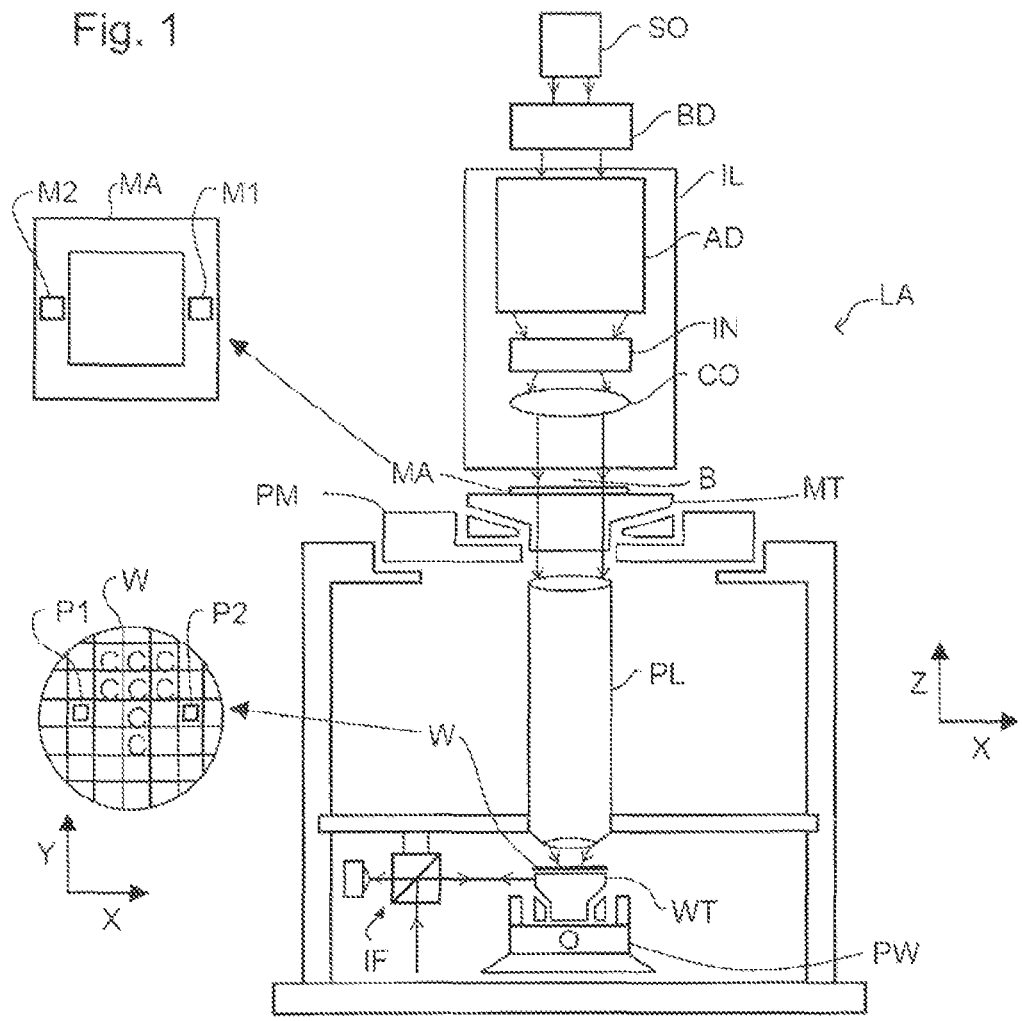
FIG. 1 is a schematic diagram of a lithographic apparatus.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described can include a particular feature, structure, or characteristic, but every embodiment can not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

FIG. 1, according to an embodiment of the present invention, schematically depicts a lithographic apparatus. The apparatus comprises includes an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist-coated wafer) W and connected to a second positioner PW configured to accurately position the substrate in accordance with certain parameters, and a projection system (e.g., a refractive projection lens system) PL configured to project a pattern imparted to the radiation beam B by patterning device MA onto a target portion C (e.g., comprising one or more dies) of the substrate W.

The illumination system can include various types of optical components, such as refractive, reflective, magnetic, electromagnetic, electrostatic, or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic, or other clamping techniques to hold the patterning device. The support structure can be a frame or a table, for example, which can be fixed or movable as required. The support structure can ensure that the patterning device is at a desired position, for example with respect to the projection system. Any use of the terms "reticle" or "mask" herein can be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam can not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device can be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is-reflected by the mirror matrix.

The term "projection system" used herein should be broadly interpreted as encompassing various types of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

In this embodiment, for example, the apparatus is of a transmissive type (e.g., employing a transmissive mask). Alternatively, the apparatus can be of a reflective type (e.g., employing a programmable mirror array of a type as referred to above, or employing a reflective mask).

The lithographic apparatus can be of a type having two (dual stage) or more substrate tables and for example, two or more mask tables). In such "multiple stage" machines the additional tables can be used in parallel, or preparatory steps can be carried out on one or more tables while one or more other tables are being used for exposure.

The lithographic apparatus can also be of a type wherein at least a portion of the substrate can be covered by a liquid having a relatively high refractive index, e.g., water, so as to fill a space between the projection system and the substrate.—An immersion liquid can also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL can comprise an adjuster AD for adjusting the angular intensity distribution of the radiation beam. Generally, at least the outer and/or inner radial extent, which are commonly referred to as σ-outer and σ-inner, respectively, of the intensity distribution in a pupil plane of the illuminator can be adjusted. In addition, the illuminator IL can comprise various other components, such as an integrator IN and a condenser CO. The illuminator can be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner) the mask table MT can be connected to a short-stroke actuator only, or can be fixed. Mask MA and substrate W can be aligned using mask alignment marks M1, M2, and substrate alignment marks P1, P2. Although the substrate alignment marks as illustrated occupy dedicated target portions, they can be located in spaces between target portions (these are known as scribe-lane alignment marks). Similarly, in situations in which more than one die is provided on the mask MA, the mask alignment marks can be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT can be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use can also be employed.

Figure 2:
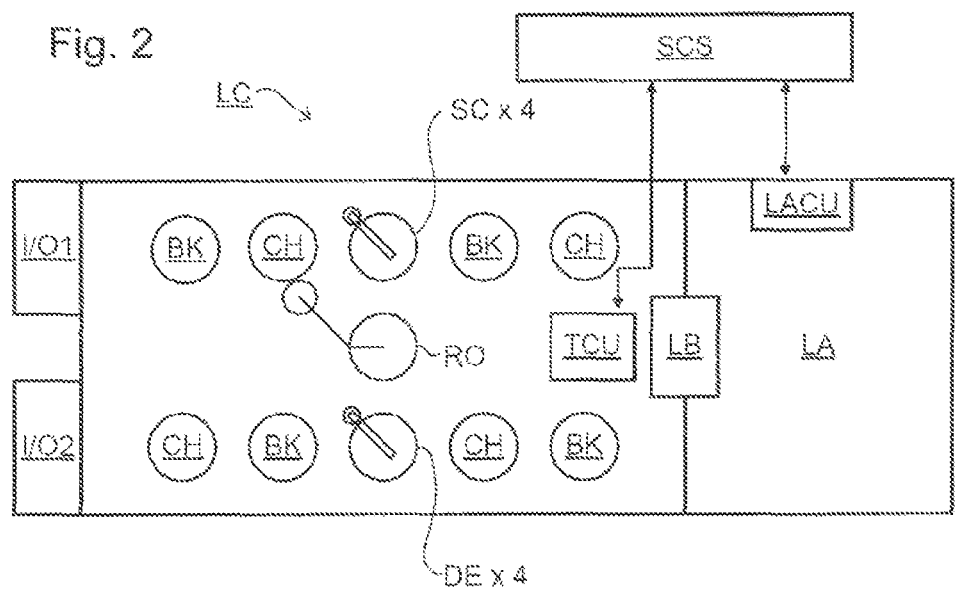
FIG. 2 is a schematic diagram of a lithographic cell or cluster.

As shown in FIG. 2, according to an embodiment of the present invention, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU that is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments, for example, can be made to exposures of subsequent substrates, especially if the inspection can be done soon and fast enough that other substrates of the same batch are still to be exposed. Also, already exposed substrates can be stripped and reworked to improve yield, or possibly be discarded, thereby avoiding performing exposures on substrates that are known to be faulty. In a case where only some target portions of a substrate are faulty, further exposures can be performed only on those target portions that are deemed to be non-faulty.

An inspection apparatus is used to determine the properties of the substrates, and in particular, how the properties of different substrates or different layers of the same substrate vary from layer to layer. The inspection apparatus can be integrated into the lithographic apparatus LA or the lithocell LC or can be a stand-alone device. To enable most rapid measurements, it is desirable that the inspection apparatus measure properties in the exposed resist layer immediately after the exposure. However, the latent image in the resist has a very low contrast, as in there is only a very small difference in refractive index between the parts of the resist that have been exposed to radiation and those that have not, while not all inspection apparatus have sufficient sensitivity to make useful measurements of the latent image. Therefore measurements can be taken after the post-exposure bake step (PEB) that is customarily the first step carried out on exposed substrates and increases the contrast between exposed and unexposed parts of the resist. At this stage, the image in the resist can be referred to as semi-latent. It is also possible to make measurements of the developed resist image, at which point either the exposed or the unexposed parts of the resist have been removed, or after a pattern transfer step such as etching. The latter possibility limits the possibilities for rework of faulty substrates but can still provide useful information.

Figure 3:
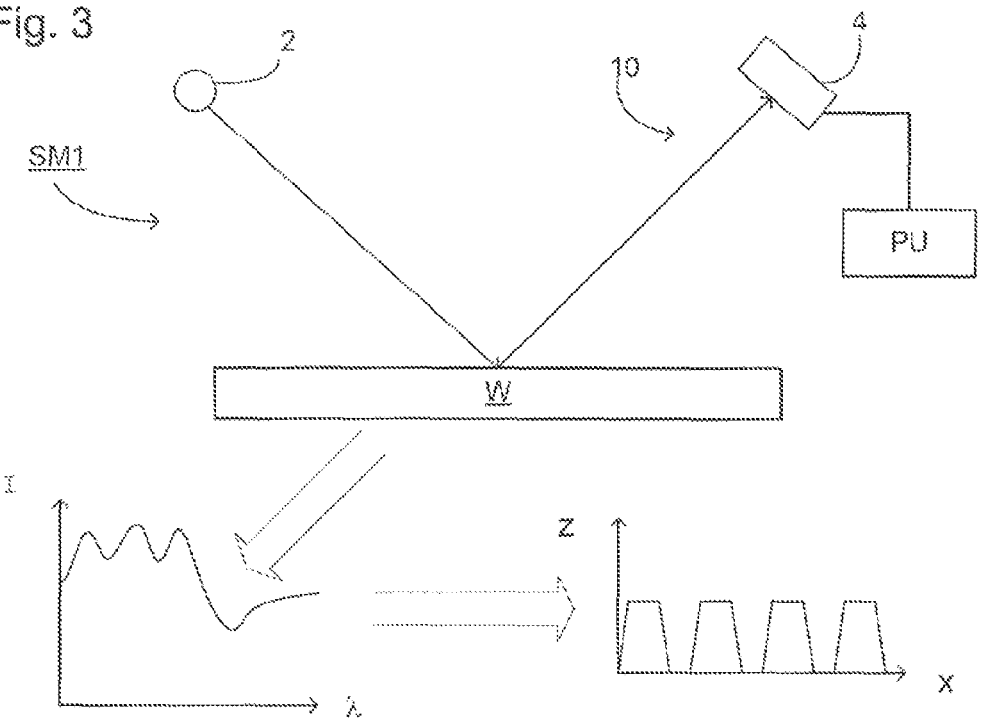
FIG. 3 illustrates the operating principles of a first scatterometer.

FIG. 3, according to an embodiment of the present invention, depicts a scatterometer that can be used in an embodiment of the present invention. It comprises a broadband (white light) radiation projector 2 that projects radiation onto a substrate W. The reflected radiation is passed to a spectrometer detector 4, which measures a spectrum 10 (intensity as a function of wavelength) of the specular reflected radiation. From this data, as shown at the bottom of FIG. 3, the structure or profile z(x) giving rise to the detected spectrum I($\lambda$) can be reconstructed by processing unit PU. This is conventionally done by Rigorous Coupled Wave Analysis (RCWA) and non-linear regression. It can be done by comparison with a library of simulated spectra. In general, for the reconstruction the general form of the structure is known and some parameters are assumed from knowledge of the process by which the structure was made, leaving only a few parameters of the structure to be determined from the scatterometry data. Such a scatterometer can be configured as a normal-incidence scatterometer or an oblique-incidence scatterometer.

Figure 4:
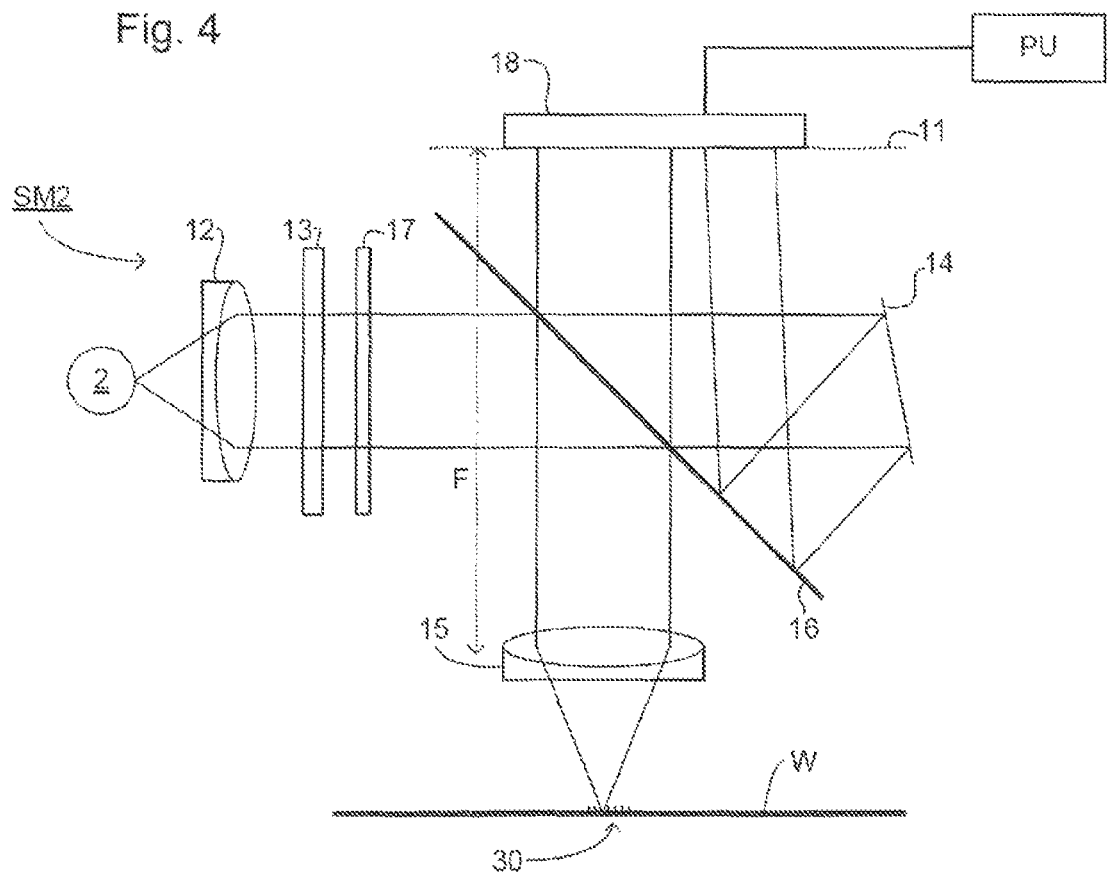
FIG. 4 illustrates the operating principles of a second scatterometer.

Another scatterometer that can be used in an embodiment of the present invention is shown in FIG. 4. In this device, the radiation emitted by radiation source 2 is collimated using lens system 12 and transmitted through interference filter 13 and polarizer 17, reflected by partially reflected surface 16 and is focused onto substrate W via a microscope objective lens 15, which has a high numerical aperture (NA), for example, preferably at least about 0.9 and more preferably at least about 0.95. Immersion scatterometers can even have lenses with numerical apertures over 1. The reflected radiation then transmits through partially reflecting surface 16 into a detector 18 in order to have the scatter spectrum detected. In one example, the detector can be located in the back-projected pupil plane 11, which is at the focal length of the lens system 15, however the pupil plane can instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 can be, for example, an array of CCD or CMOS sensors, and can use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18 or alternatively on to a different detector (not shown).

A set of interference filters 13 is available to select a wavelength of interest in the range of, for example, 405-790 nm, or even lower, such as 200-300 nm. The interference filter can be tunable rather than comprising a set of different filters. A grating could be used instead of interference filters. In the following description, the term 'light' shall be used to refer to the radiation used in the scatterometry technique. Use of the term 'light' in relation to radiation used in scatterometry or any other metrology technique is not intended to imply any limitation to radiation in the visible part of the spectrum.

The detector 18 can measure the intensity of scattered light at a single wavelength (or narrow wavelength range), the intensity separately at multiple wavelengths or integrated over a wavelength range. Furthermore, the detector can separately measure the intensity of transverse magnetic- and transverse electric-polarized light and/or the phase difference between the transverse magnetic- and transverse electric-polarized light.

Using a broadband light source (i.e., one with a wide range of light frequencies or wavelengths, and therefore a wide range of colors is possible, which gives a large Etendue, allowing the mixing of multiple wavelengths. Where a component in the broadband mix has a bandwidth of, say, $\Delta\lambda$, it can be advantageous to provide a spacing of at least 2 $\Delta\lambda$ (i.e., twice the bandwidth) between components. A plurality of "sources" of radiation can be different portions of an extended radiation source that have been split using fiber bundles. In this way, angle resolved scatter spectra can be measured at multiple wavelengths in parallel. A 3-D spectrum, for example, such as wavelength and two different angles, can be measured, which contains more information than a 2-D spectrum. This allows more information to be measured which increases metrology process robustness. This is described in more detail in European Patent No. 1,628,164A, which is incorporated by reference herein in its entirety.

The target 30 on substrate W can be a 1-D grating, which is printed such that after development, the bars are formed of solid resist lines. The target 30 can be a 2-D grating, which is printed such that after development, the grating is formed of solid resist pillars or vias (holes) in the resist. The bars, pillars, or vias can alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, can be input to the reconstruction process, performed by processing unit PU, from knowledge of the printing step and/or other scatterometry processes.

Using one of the scatterometers described above in combination with modeling of a target structure such as the target 30 and its diffraction properties, measurement of the shape and other parameters of the structure can be performed in a number of ways. In a first type of process, represented by FIG. 5, according to an embodiment of the present invention, a diffraction pattern based on a first estimate of the target shape, e.g., a first candidate structure, is calculated and compared with the observed diffraction pattern. Parameters of the model are then varied systematically and the diffraction re-calculated in a series of iterations, to generate new candidate structures and so arrive at a best fit. In a second type of process, represented by FIG. 6, according to an embodiment of the present invention, diffraction spectra for many different candidate structures are calculated in advance to create a library of diffraction spectra. Then the diffraction pattern observed from the measurement target is compared with the library of calculated spectra to find a best fit. Both methods can be used together where a coarse fit can be obtained from a library, followed by an iterative process to find a best fit.

Figure 5:
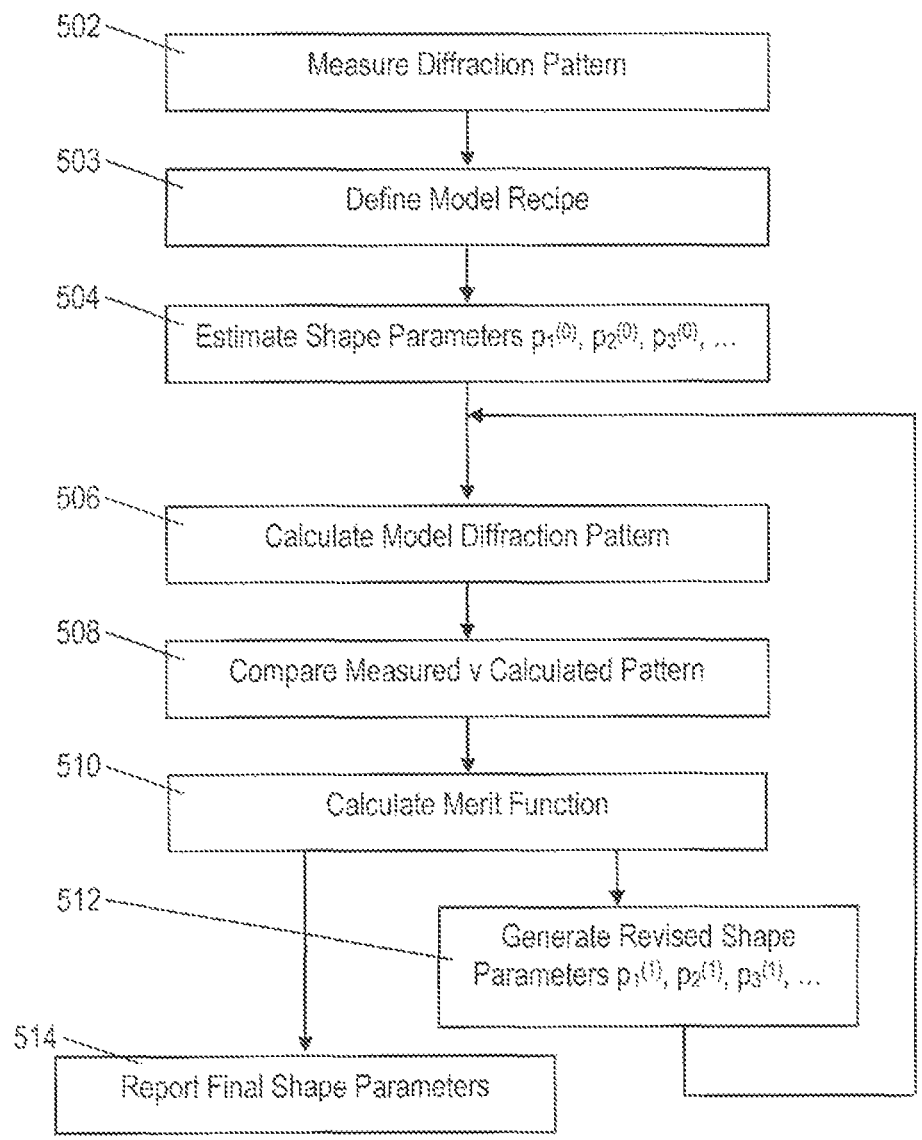
FIG. 5 depicts a first example process for reconstruction of a structure from scatterometer measurements, according to an embodiment of the present invention.

Referring to FIG. 5 in more detail, the way the measurement of the target shape and/or material properties is carried out will be described in summary. The target will be assumed for this description to be a 1-dimensional (1-D) structure. In practice it can be 2-dimensional, and the processing will be adapted accordingly.

Step 502: The diffraction pattern of the actual target on the substrate is measured using a scatterometer such as those described above. This measured diffraction pattern is forwarded to a calculation system such as a computer. The calculation system can be the processing unit PU referred to above, or it can be a separate apparatus.

Step 503: A 'model recipe' is established that defines a parameterized model of the target structure in terms of a number of parameters $p_i$ ($p_1$, $p_2$, $p_3$ and so on). These parameters can represent for example, in a 1D periodic structure, the angle of a side wall, the height or depth of a feature, the width of the feature. Properties of the target material and underlying layers are also represented by parameters such as refractive index e.g., at a particular wavelength present in the scatterometry radiation beam. Specific examples will be given below. Importantly, while a target structure can be defined by dozens of parameters describing its shape and material properties, the model recipe will define many of these to have fixed values, while others are to be variable or 'floating' parameters for the purpose of the following process steps. Further below we describe the process by which the choice between fixed and floating parameters is made. Moreover, we shall introduce ways in which parameters can be permitted to vary without being fully independent floating parameters. For the purposes of describing FIG. 5, only the variable parameters are considered as parameters $p_i$ 504: A model target shape is estimated by setting initial values $p_i^{(0)}$ for the floating parameters (i.e., $p_1^{(0)}$, $p_2^{(0)}$, $p_3^{(0)}$ and so on). Each floating parameter will be generated within certain predetermined ranges, as defined in the recipe.

Step 506: The parameters representing the estimated shape, together with the optical properties of the different elements of the model, are used to calculate the scattering properties, for example using a rigorous optical diffraction method such as RCWA or any other solver of Maxwell equations. This gives an estimated or model diffraction pattern of the estimated target shape.

Steps 508, 510: The measured diffraction pattern and the model diffraction pattern are then compared and their similarities and differences are used to calculate a "merit function" for the model target shape.

Step 512: Assuming that the merit function indicates that the model needs to be improved before it represents accurately the actual target shape, new parameters $p_1^{(1)}$, $p_2^{(1)}$, $p_3^{(1)}$, etc. are estimated and fed back iteratively into step 506. Steps 506-512 are repeated.

In order to assist the search, the calculations in step 506 can further generate partial derivatives of the merit function, indicating the sensitivity with which increasing or decreasing a parameter will increase or decrease the merit function, in this particular region in the parameter space. The calculation of merit functions and the use of derivatives is generally known in the art, and will not be described here in detail.

Step 514: When the merit function indicates that this iterative process has converged on a solution with a desired accuracy, the currently estimated parameters are reported as the measurement of the actual target structure.

The computation time of this iterative process is largely determined by the forward diffraction model used, i.e., the calculation of the estimated model diffraction pattern using a rigorous optical diffraction theory from the estimated target structure. If more parameters are required, then there are more degrees of freedom. The calculation time increases in principle with the power of the number of degrees of freedom. The estimated or model diffraction pattern calculated at 506 can be expressed in various forms. Comparisons are simplified if the calculated pattern is expressed in the same form as the measured pattern generated in step 510. For example, a modeled spectrum can be compared easily with a spectrum measured by the apparatus of FIG. 3; a modeled pupil pattern can be compared easily with a pupil pattern measured by the apparatus of FIG. 4.

Throughout this description from FIG. 5 onward, the term 'diffraction pattern' will be used, on the assumption that the scatterometer of FIG. 4 is used. The skilled person can readily adapt the teaching to different types of scatterometer, or even other types of measurement instrument.

Figure 6:
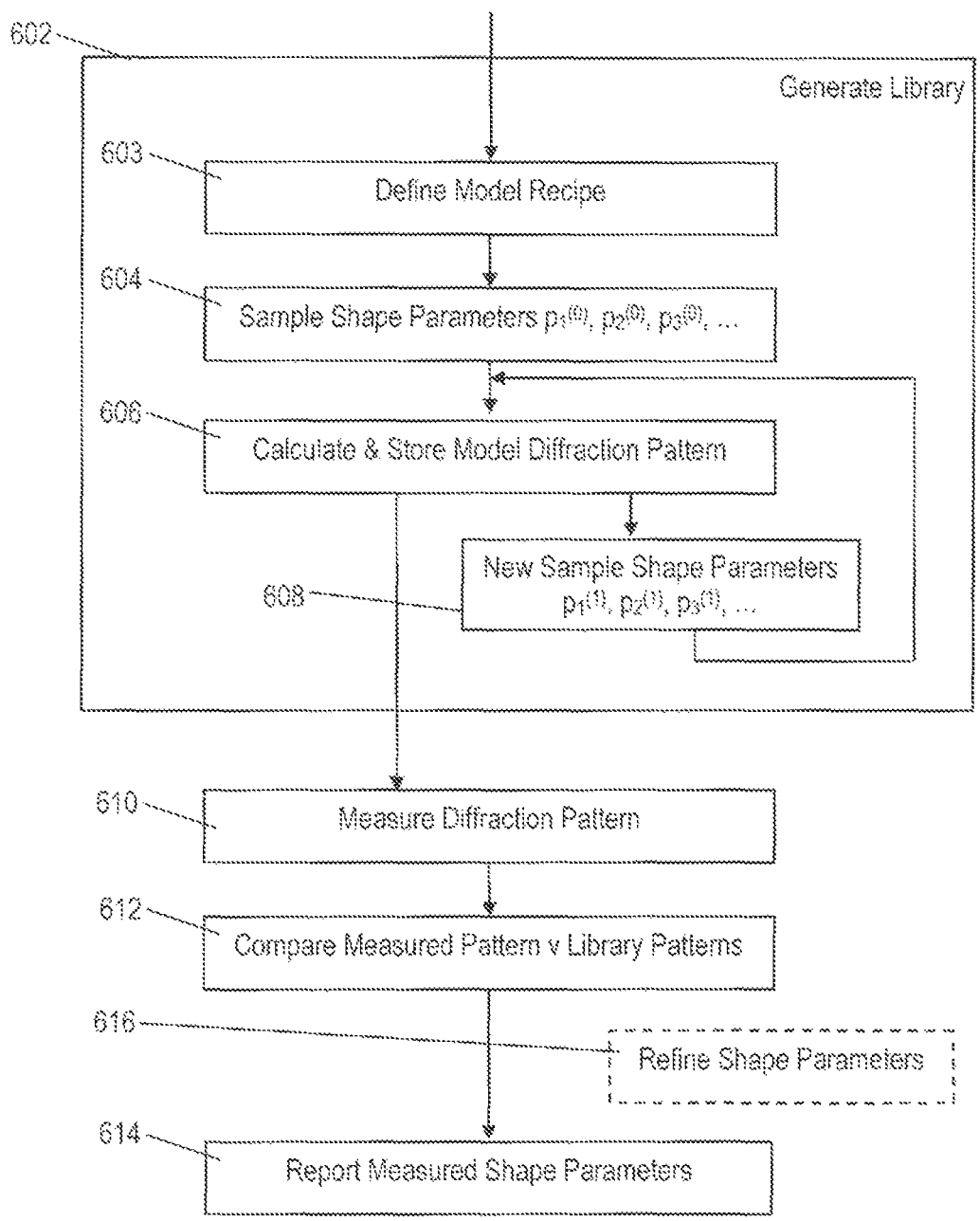
FIG. 6 depicts a second example process for reconstruction of a structure from scatterometer measurements, according to an embodiment of the present invention.

FIG. 6, according to an embodiment of the present invention, illustrates an alternative example process in which plurality of model diffraction patterns for different estimated target shapes, e.g., candidate structures, are calculated in advance and stored in a library for comparison with a real measurement. The underlying principles and terminology are the same as for the process of FIG. 5. The steps of the FIG. 6 process are:

Step 602: The process of generating the library begins. A separate library can be generated for each type of target structure. The library can be generated by a user of the measurement apparatus according to need, or can be pre-generated by a supplier of the apparatus.

Step 603: A 'model recipe' is established which defines a parameterized model of the target structure in terms of a number of parameters $p_i$ ($p_1$, $p_2$, $p_3$ and so on). Considerations are similar to those in step 503 of the iterative process.

Step 604: A first set of parameters $p_1^{(0)}$, $p_2^{(0)}$, $p_3^{(0)}$, etc. is generated, for example by generating random values of all the parameters, each within its expected range of values.

Step 606: A model diffraction pattern is calculated and stored in a library, representing the diffraction pattern expected from a target shape represented by the parameters.

Step 608: A new set of shape parameters $p_1^{(1)}$, $p_2^{(1)}$, $p_3^{(1)}$, etc. is generated. Steps 606-608 are repeated tens, hundreds, or even thousands of times, until the library which comprises all the stored modeled diffraction patterns is judged sufficiently complete. Each stored pattern represents a sample point in the multi-dimensional parameter space. The samples in the library should populate the sample space with a sufficient density that any real diffraction pattern will be sufficiently closely represented.

Step 610: After the library is generated (though it could be before), the real target 30 is placed in the scatterometer, and its diffraction pattern is measured.

Step 612: The measured pattern is compared with the modeled patterns stored in the library to find the best matching pattern. The comparison can be made with every sample in the library, or a more systematic searching strategy can be employed, to reduce computational burden.

Step 614: If a match is found then the estimated target shape used to generate the matching library pattern can be determined to be the approximate object structure. The shape parameters corresponding to the matching sample are output as the measured shape parameters. The matching process can be performed directly on the model diffraction signals, or it can be performed on substitute models which are optimized for fast evaluation.

Step 616: Optionally, the nearest matching sample is used as a starting point, and a refinement process is used to obtain the final parameters for reporting. In an embodiment, this refinement process can comprise an iterative process very similar to that shown in FIG. 5, for example.

Whether refining step 616 is needed or not is a matter of choice for the implementer. If the library is very densely sampled, then iterative refinement can not be needed because a good match will always be found. On the other hand, such a library might too large for practical use. A practical solution is thus to use a library search for a coarse set of parameters, followed by one or more iterations using the merit function to determine a more accurate set of parameters to report the parameters of the target substrate with a desired accuracy. Where additional iterations are performed, it would be an option to add the calculated diffraction patterns and associated refined parameter sets as new entries in the library. In this way, a library can be used initially which is based on a relatively small amount of computational effort, but which builds into a larger library using the computational effort of the refining step 616. Whichever scheme is used, a further refinement of the value of one or more of the reported variable parameters can also be obtained based upon the goodness of the matches of multiple candidate structures. For example, the parameter values finally reported can be produced by interpolating between parameter values of two or more candidate structures, assuming both or all of those candidate structures have a high matching score.

Figure 7:
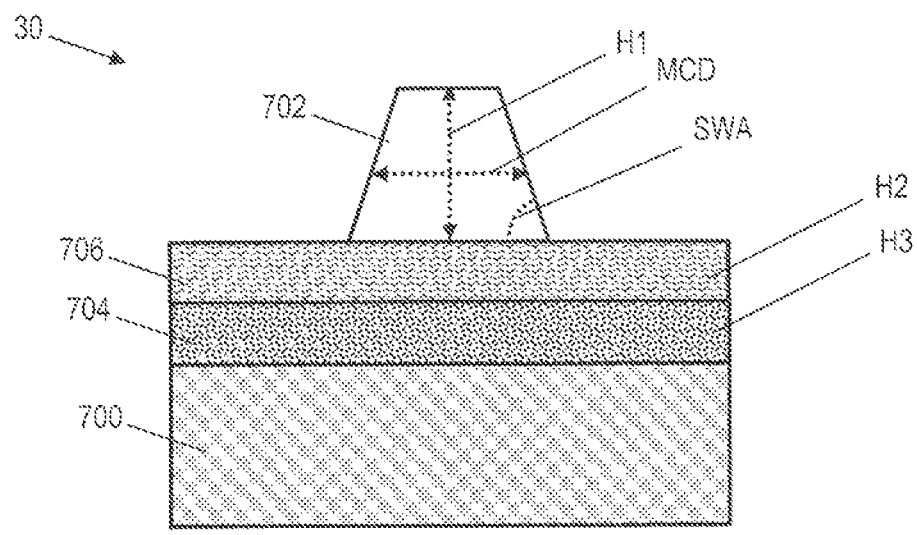
FIG. 7 is a schematic cross-section through a first example structure to be measured by the process of FIG. 5 or FIG. 6, with associated model parameters, according to an embodiment of the present invention.

FIG. 7, according to an embodiment of the present invention, illustrates a very simple form of target 30, and some of the parameters that define its shape. A substrate 700, for example a silicon wafer, carries a diffraction grating formed by many parallel bars that have been formed by exposing and developing a layer of resist material. The target grating need not comprise raised bars, which are illustrated and mentioned as only an example. Suitable features include upstanding bars, contact holes, etc, that have been formed by lithography, or by lithography followed by etching, deposition and other process steps. Bars are chosen here purely for simplicity.

Feature 702 represents a cross section of one of the structures that make up the grating. Under the resist is a layer 704, which in a common example would be simply the 'native' oxide layer on a silicon wafer, for example having a thickness of 1 to 3 nm. In a real product, there can be many layers of different properties under the target 30. Prior to coating the substrate with resist and exposing, an anti-reflective BARC layer 706 has been coated on the substrate to improve the quality of the printed pattern, in a known manner.

Parameters of the feature 702, which are to be measured by a process such as shown in FIG. 5 or FIG. 6, include feature height H1, mid-height critical dimension, e.g., mid-CD or MCD, and side wall angle SWA. Other parameters can be defined if desired. SWA can be defined separately for left and right side walls, if asymmetries are to be measured. Any other features like top rounding, footing or a coating trapezoid accounting for Line Edge Roughness ("LER") might be added to the model to increase accuracy.

These parameters H1, MCD, SWA will contribute in different ways to the diffraction pattern that will be observed when this target 30 is measured by scatterometry. Other shape parameters that will affect the diffraction pattern are the heights, e.g., thicknesses, of the underlying layers 706, 704, which are labeled H2, H3 respectively. In addition to geometrical parameters, optical parameters can be also included in the model. To model the target, and so permit the calculation of modeled diffraction patterns, estimated values for these parameters are used in the calculations of step 506 and/or 606. When one takes into account the number of layers, the shape parameters of the feature 702 and potentially also underlying features and layers, it becomes clear that the parameter space, in which the search for the best fitting parameter set is to be performed, is highly multi-dimensional. The target grating pattern itself can be two-dimensional. Additional parameters required for modeling are the properties of all the different materials, such as their refractive indices, extinction coefficients. These can be so well defined that they can be regarded as fixed parameters, or they can themselves be subject to uncertainties. They can need to be further subdivided according to the wavelength and polarization of the incoming radiation.

In the generation of sample parameter sets, each floating parameter is allowed to vary randomly within a permitted minimum-maximum range. Similarly, in the iterative process of FIG. 5, the parameters are allowed to vary in all kind of combinations as long as each parameter fits in a pre-defined min-max range. In products produced by the real lithographic process, however, many relationships exist between different parameters, so that two parameters do not in practice vary completely independently of one another. For instance, critical dimension and side wall MCD vs. SWA tend to vary together.

In an embodiment, the measurement processes of FIGS. 5 and 6 use modified processing to generate the sample parameter sets. One modification is to restrict the parameter sets considered, in accordance with a definition of 'realistic' versus 'unrealistic' candidate structures. Effectively the permitted range of one parameter is restricted according to the value of another parameter of parameters. This modification, which is subject of co-pending patent application, U.S. Patent Application No. 61/346,246, which is incorporated by reference herein in its entirety, and will be described later with reference to FIGS. 14 to 16, under the heading 'Realistic Sampling.' Another modification, which is referred to as 'Recipe Optimization' will be described with reference to FIGS. 8 to 13. These modifications can be applied independently or together. These headings are used for ease of description and are not intended to be limiting on the scope of the teaching.

Model Recipe Optimization—Background

Optical profile metrology uses a model fit approach to extract parameters of a target structure from a scatterometry measurement signal. Typical fitting techniques use direct regression, e.g., FIG. 5, or a library based synthetic signal-model, e.g., FIG. 6. There can be several floating parameters, as discussed above. Some of these floating parameters can be relevant only internally of the model, others are genuine parameters of interest which the system user wants to determine through the measurement process. The model recipe has to be optimized for 2 aspects:

1. Accuracy: Measured by the root mean square error or RMSE. Accuracy can be decomposed into noise sensitivity and bias, e.g., systematic error.
2. Model optimization typically has three goals:
   1. obtain optimal measurement response to actual variations of the parameters of interest
   2. obtain insensitivity of measurements of parameters of interest to noise, calibration errors, model approximations, and variation of other parameters.
   3. achieve speed of preparation or execution of the fitting process.

An approach is to set up a general model recipe with sufficient floating parameters to describe all possible variations of the actual structures to be measured. The operator will then fix a subset of these parameters at respective nominal values, to obtain the above mentioned goals.

If the typical variation of a specific parameter that occurs in the application has little or no impact on the measurement signal it is indeed advantageous to fix that parameter, in particular for the $2^{nd}$ and $3^{rd}$ goals. For the second goal, the degrees of freedom in the matching process are reduced when a parameter is fixed, which typically improves the stability (condition number) and noise robustness of the fitting process. For the $3^{rd}$ goal the speed of the fitting process should increase when a parameter is fixed. In direct regression, for example, a Gauss-Newton (GN) iteration method is often used. The time used for the GN step increases linearly with the number of derivates that have to be calculated, and hence is proportional to the degrees of freedom. In library based matching, the number of entries in the library, and hence the preparation time, scales with the power of the degrees of freedom Mathematically, the state of the art is to determine the best fit between measured and modeled signals, where the modeled signal depends on the parameters $p_i$. This best fit can be expressed in the form of Equation (1):

$$P_{fit} = ^{argmin}{}_P \|S_{meas} - S_{mod}(P_{cand})\|^2 \quad (1)$$

where $P_{fit}$ is the best fitting set of floating parameters $p_i$ mentioned above, $S_{meas}$ represents the measured diffraction signal and $S_{mod}(P_{cand})$ represents the modeled diffraction signal for a candidate parameter set $P_{cand}$. These signals can be regarded as vectors whose components are, for example, individual pixel values of a diffraction pupil pattern. The norm $\|\ldots\|$ in Equation (1) thus represents the 'distance' or error between the measured signal and each modeled signal. The fitting process is conducted to seek the parameter set P for which this error is minimized.

The model recipe is optimized by fixing one or more parameters $p_i$ of the parameter set, to get closer to the 3 goals mentioned above. Where a parameter is fixed, the value it is fixed at is referred to as its nominal value. It can be that this nominal value is what the lithographic process is aiming at, or it can be fixed simply for the purposes of this model recipe. Mathematically, the optimized recipe looks then like:

$$P_{fit} = ^{argmin}{}_P \|S_{meas} - S_{mod}(P_{cand})\|^2 \text{ subject to } p_i = p_{i,nom}$$
$$\text{for certain fixed } p_i \text{'s} \quad (2)$$

where $p_{i,nom}$ represents the nominal value of parameter $p_i$.

Recipe optimization is often a matter of trial-and-error, by which experienced scientists or technicians attempt to find a good set of fixed/floating parameters. The 'art' is to determine that fix/float set of parameters that has the optimal balance between the adverse impact and positive effects mentioned above. In various cases that optimal balance is still a compromise, and somewhat unsatisfactory. A particular problem arises, for example, if one of the parameters has a small but measurable impact on the measured signal, and the signature of that impact is highly correlated with the impact of a parameter of interest. In such a case, fixing the first parameter has an adverse impact on goal number 2, since an actual variation of that first parameter is now wrongly interpreted as an apparent variation in the parameter of interest. The only way to improve accuracy, in the state of the art, is to allow more parameters to float than are really of interest.

The inventors have identified the following factors which limit the success of recipe optimization:

The operator has only limited freedom to adjust the recipe, because each a parameter must be either fixed to a nominal value or independently floating;

Whereas sensitivity can be measured, the RMSE is not easily determined since it is unknown what element of the error is systematic bias caused by correlation between parameters. The impact of fixing a parameter is therefore unknown.

Related to the previous item, it is unclear how to determine an optimal selection of fixed and floating parameters, in a systematic way and without spending excessive machine time.

A way to reduce the degrees of freedom is by measuring some of the parameters separately, and feeding them forward into the recipe. This is an effective strategy, but requires additional measurement and so degrades throughput. The strategies can be combined with novel strategies described herein, to further enhance the measurement performance for the parameters of interest.

Model Recipe Optimization with Reduced Degrees of Freedom

Model recipe optimization applied at steps 503 and/or 603 in the processes of FIGS. 5 and 6 respectively, is performed so as to reduce the degrees of freedom in the fitting process without the drawbacks of simply fixing more of the model parameters. Furthermore, an automated tool is provided which will set or at least suggest a model recipe according to the parameters of the model and the parameters of interest.

Instead of fixing certain parameters to a given value, and allowing others to float independently of one another, the novel apparatus performs the minimization under a more generic set of conditions, including constraints. The present embodiment uses constraints of a form which fix a linear combination of parameters, but this is just one example. In mathematical form:

$$P_{fit} = \underset{p}{argmin} \|S_{meas} - S_{mod}(P_{cand})\|^2 \text{ subject to } A(P_{cand} - P_{nom}) = 0 \quad (3)$$

where A is a matrix expression of a set of constraints that can be chosen to approach the goals mentioned above with fewer compromises. Specifically, allowing these constraints in the model recipe allows degrees of freedom in the model to be reduced without necessarily fixing parameters.

Expanding the matrix expression of the constraints $(A(P_{cand} - P_{nom}) = 0$ in Equation (3)), a constraint is defined as follows:

$$\sum_{j=1}^{n} \alpha_j (p_j - p_j^{nom}) = 0 \quad (4)$$

where a set of coefficients $\alpha_j$ form one row of matrix A and $p_j^{nom}$ is the nominal value of parameter $p_j$. A number of constraints can be defined, each represented by a row in the matrix A. Note that the values of the parameters are not used to express the constraint, but their deviations from nominal (p−pnom) are used. Each constraint defines a linear combination of the parameters for which αj is non-zero. Fixed parameters can and typically will also be used, as in Equation (2). For a fixed parameter, p−pnom=0. Fixing a parameter pj is a special case of the more general constraints that can be represented in Equation (3), in which only the relevant coefficient αj is non-zero.

While a fixed parameter obviously reduces the number of degrees of freedom by one, the more general constraint of Equation (4) can also reduce degrees of freedom. This is because two or more parameters related by the constraint are no longer independent, but must vary together. Consequently, in the fitting process, it is sufficient to allow just one of these parameters to float in the normal way, and to calculate the other(s) through a dependency relation. As an example, a dependency relation can be created from a constraint by moving one parameter to the other side of the equals sign in Equation (4), which results in:

$$p_k = p_k^{nom} + \sum_{\substack{j=1 \\ j \neq k}}^{n} \beta_j (p_j - p_j^{nom}) \quad (5)$$

Accordingly, in the methods of FIGS. 5 and 6, the recipe defined in step 503 or 603 includes a set of constraints, such that one or more parameters which are not fixed are nonetheless not degrees of freedom, but can be calculated via dependency relations from other parameters.

Additionally, a tool referred to below as the 'parameter advisor' is created, to automatically determine the RMSE error as a result of the generic conditions. This tool helps determining an optimal configuration. The operator does not need to define the constraints explicitly—they can be found by the tool based on process simulations. Before describing this tool, however, we present some illustrations of the principles and benefits of using constraints.

The invention allows the software more freedom to optimize for speed and accuracy. The application of a condition during the fit still reduces the noise sensitivity and the degrees of freedom. The expansion towards more generic conditions improves the first goal. We have two examples to show the merit of the proposed approach, followed by some practical results.

First Example Linear Constraint

Figure 8:
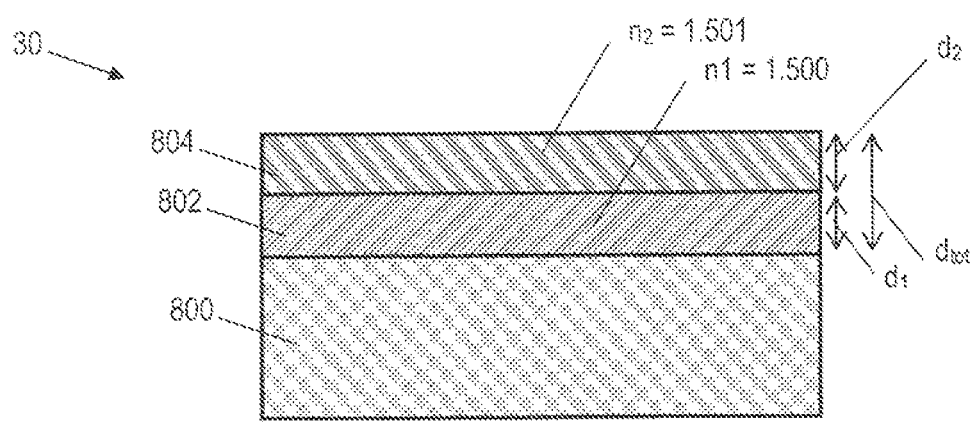
FIG. 8 is a schematic cross-section through a second example structure to be measured by the process of FIG. 5 or FIG. 6, with associated model parameters, according to an embodiment of the present invention.

A first example for illustrating the principles and benefits of these more generic conditions is a situation where the model contains two correlated parameters. FIG. 8, according to an embodiment of the present invention, shows an example in which the structure of target 30 comprises a substrate 800 with first and second layers 802, 804 formed thereon. First layer 802 has a thickness or height d1 and refractive index n1. Second layer 804 has a height d2 and refractive index n2. Another property of the structure is the sum height of the two layers, labeled dtot. The sum dtot of the two parameters can be made a parameter, and can be determined by any reasonably accurate model with good certainty. The refractive indices, for the sake of this example, are extremely close in value, however. Therefore it will be understood that any optical measurement technique will have difficulty resolving the parameters $d_1$ and $d_2$ individually.

Figure 9:
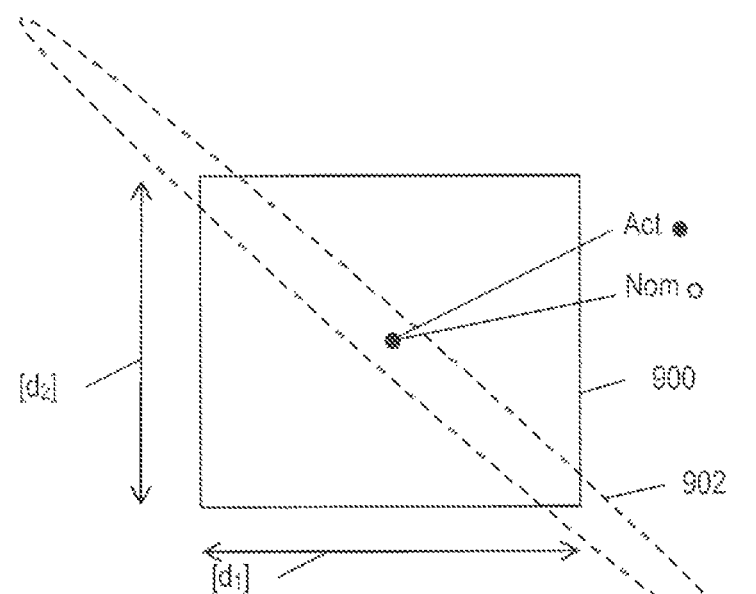
FIG. 9(a) illustrates certain principles for understanding the reconstruction process in a first example application, according to an embodiment of the present invention.
FIG. 9(b) contrasts results using floating & fixed parameters according to the state of the art in the first example application, with results using one linear constraint, according to an embodiment of the present invention.
Figure 9:
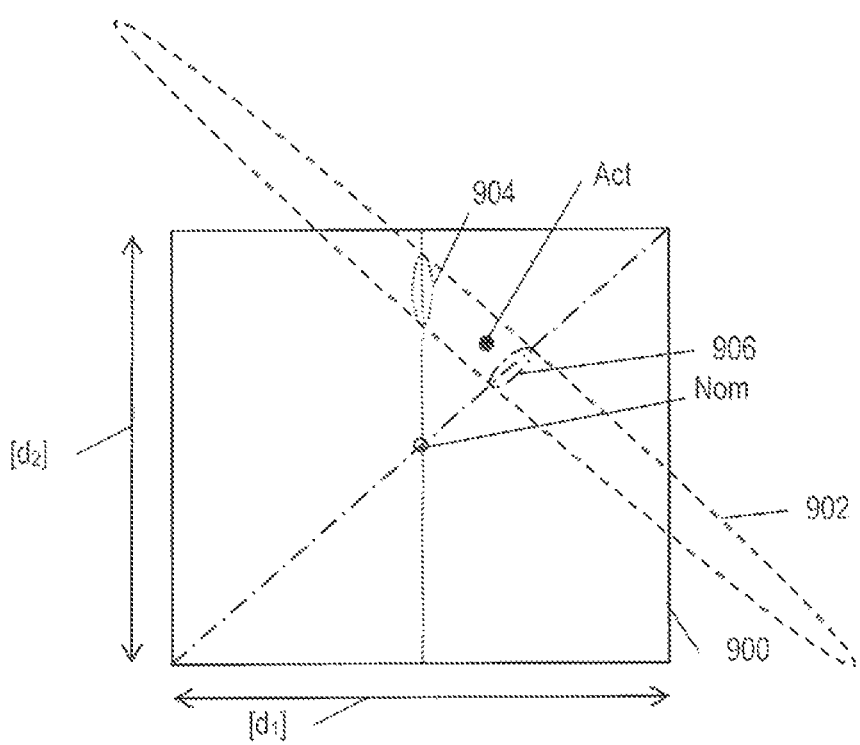

Referring to FIG. 9($a$), according to an embodiment of the present invention, we see that each parameter $d_1$, $d_2$ is bound to a respective interval [$d_1$], [$d_2$] respectively. Plotting just these parameters as a two-dimensional parameter space, see the result is a rectangle 900 in the actual dimensions of the measured structure must lie. The ranges of deviation are, in this example, symmetrically centered on the nominal values of their respective parameters. A dot labeled Act represents a location in parameter space of a sample which is exactly on the nominal value. The nominal value is represented by an open dot labeled Nom, which in FIG. 9($a$) is hidden by the solid dot. Due to their correlation, the information in the measured signal is not sufficient to determine each of the two parameters with an uncertainty below the parameter range supplied by the user.

It is useful in this context to consider a hypothetical Probability Density Function (PDF) which represents the likelihood of parameters being found by the fitting process to lie in a particular part of the parameter space. The ellipse 902 in this example is intended to represent the contour of 95% probability with both parameters $d_1$ and $d_2$ floating. The ellipse is narrowly aligned with the falling diagonal of the rectangle. This can be understood from the fact that the sum height $d_{tot} = d_1 + d_2$ is well known from other calculations. Clearly the probability function extends beyond the known parameter ranges, and the model has difficulty determining where on that diagonal a measured sample lies. In practical terms, this indicates that the model diffraction patterns for many combinations of these two parameters are so similar that noise within the measured pupil pattern defeats any attempt to fit the measured pattern to a particular value of $d_1$ or $d_2$.

FIG. 9($b$), according to an embodiment of the present invention, illustrates and compares the performance of a strategy, e.g., fix a parameter, and the novel method as proposed in this application, e.g., linear constraint, when sum height $d_{tot}$ is not at its nominal value. The actual target structure lies at the solid dot Act in parameter space. The ellipse 902 again represents the 95% PDF with both parameters $d_1$ and $d_2$ floating. If one adopts the conventional approach and fixes $d_1$ at its nominal value, the area of search is confined to the vertical dotted line. The probability density function with $d_1$ fixed then changes to the smaller, dotted ellipse 904.

The rising diagonal dash-dot line represents a linear constraint, according to which $\alpha_d(d_1-d_2)=0$, where $\alpha_d$ is a coefficient of the linear constraint which relates the two height parameters (and where $d_1$ and $d_2$ stand for the deviations from nominal of the respective parameters, not their absolute values). The resulting PDF represented by the dash-dot ellipse 906 is the smallest of the three ellipses, indicating that these parameters are not found with less noise in the measurement. The center of gravity of the PDF 906 is also equal to that of the original PDF 902, bounded by the ranges of d1 and d2.

From FIG. 9(*b*) the skilled reader will also see the last figure it can be seen that the linear constraint has a better noise level, a smaller offset and allows a larger range of actual measurements than the parameter fix method ($d_1-d_1^{nom}=0$).

Second Example Linear Constraint

Figure 10:
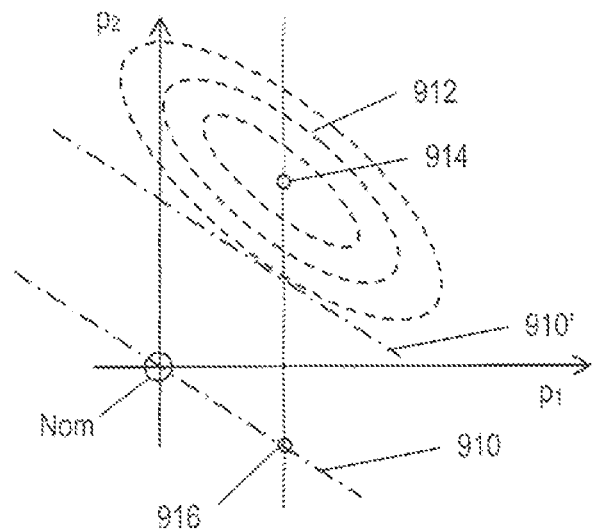
FIG. 10 illustrates the operation of a linear constraint in a second example application, according to an embodiment of the present invention.

FIG. 10, according to an embodiment of the present invention, illustrates a second example of the application of linear constraints for improved model recipes. In this case, two generic parameters $p_1$ and $p_2$ are involved. Horizontal and vertical axes correspond to the deviations of these parameters, rather than their absolute values. The uncertainty (noise) in this example is well below the allowed parameter ranges, so that no rectangular bounding box is seen within the diagram. Here, a useful piece of information for the recipe optimization is that we are only interested in measuring one of the parameters, $p_1$. As before, $p_1$ and $p_2$ are correlated so that floating both parameters would give a large uncertainty, while fixing $p_2$ would introduce an unnecessarily large error in $p_1$. The inventors have recognized that a constraint, for example a linear constraint 910 is still possible in many such situations, which will reduce the degrees of freedom in the model and improve accuracy at the same time. If the Hessian of the model, representing the second order partial derivatives of the merit function, is uniform across the parameter space, then this constraint will be valid for all sampled points in parameter space and can therefore be imposed as part of the recipe definition. This situation will often apply when modeling tightly-controlled production processes with narrow permitted ranges for the parameters, and can be tested in the model optimization process. In the parameter advisor module, described below, the appropriateness of such an assumption can be tested by inspecting the calculated derivatives.

In the diagram, the actual values of parameters $p_1$ and $p_2$ are not known and not shown. Suppose that contours 912 represent the 'cost function' of the model, based on an observed diffraction pattern. Applying Equation (1) without constraints, the fitting process would arrive at point 914. Applying the linear constraint forces $p_1$ and $p_2$ to lie along the line 910 having a certain slope and passing through the nominal position Nom. Instead of lying at the centre of the cost function contours, therefore, the reported (measured) value of the parameters lies at point 916 which is at the point on the constraint line where it is tangential to a cost function contour (compare parallel line 910'). By reporting point 916 as the measured parameters instead of point 914, the value of $p_2$ which is reported may or may not be further from the actual value. However, parameter $p_2$ is not of interest, and the certainty with which the parameter $p_1$ is reported, which is of interest, can be greatly enhanced as a result.

The number of degrees of freedom in the diffraction model calculations is reduced by one for each constraint of this type that can be applied. In the first example above, the constraint ($d_1+d_2=d_{tot}$ or $d_{tot}-d_1-d_2=0$) can be regarded as a 'natural' constraint, caused by the model having more variable parameters than there are really degrees of freedom. The constraint $\alpha_d(d_1-d_2)=0$, and the constraint on the parameters $p_1$ and $p_2$ in the second example, indicate a relationship between parameters which turn out, in practice, to be correlated, while this correlation is neither inevitable, explicit, nor 'physical' in meaning. The novel technique and the tools described further below are able to identify such additional constraints, independently of explicit knowledge of the so-called 'natural' constraint. The novel technique and tools are also able to identify additional constraints involving three or more parameters, where the known natural constraints tend to relate only a pair of parameters at a time.

It is a matter of design choice whether the so-called natural constraints are regarded as part of the model, or as part of the model recipe. Whichever way they are classified, the inclusion of these natural constraints in a sensible implementation would not be regarded as reducing the number of degrees of freedom, because the designer of the model never provided that degree of freedom in the first place. Also, the natural constraints are given, rather than being evaluated as constraints which may or may not be included in an optimized model recipe.

Example Results

Figure 11:
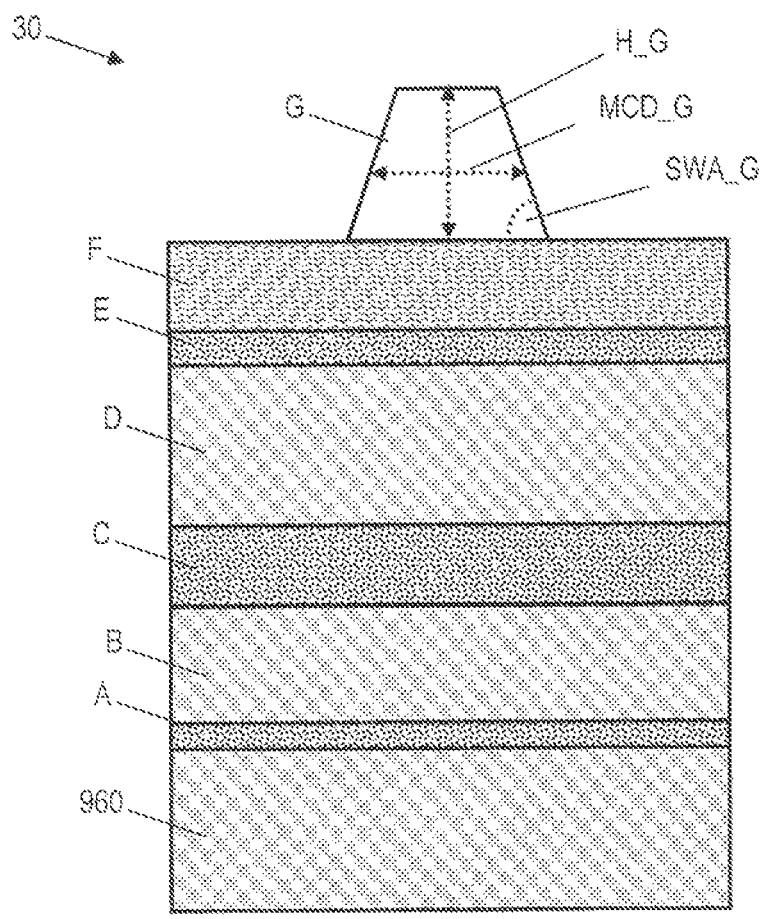
FIG. 11 illustrates a complex structure for comparison of performance of a reconstructions process without linear constraints and with linear constraints, according to an embodiment of the present invention.

FIG. 11, according to an embodiment of the present invention, illustrates a complex target structure 30 which for the sake of experiment was formed in 75 separate fields over a 300 mm substrate in a focus-exposure matrix (FEM) process. As is well known, a non-random FEM process is designed to vary parameters of the lithographic steps in a systematic and known way across fields of a substrate such as a silicon wafer. In this target structure, layers A through G are formed in a stack on a substrate 960. The top layer G is patterned using the lithographic apparatus and has shape parameters H_G, MCD_G and SWA_G similar to features 702 in FIG. 7. These three were defined as the parameters of interest. Each underlying layer A to F has its own height (H_A etc.) and material properties. For the purposes of experimentation, nominal values for all heights are known, but only layer A is fixed. Material properties such as refractive index were also fixed. This leaves 10 floating parameters and 10 degrees of freedom, which is an unusually high number of degrees of freedom for state-of-the-art methods. a lot of iterations are needed to come to a converging result. Typically 3 to 7 iterations are considered acceptable for a commercial metrology tool. With these ten floating parameters, between 6 and 39 iterations per field were needed, averaging over 13 iterations per field.

With use of the parameter advisor tool (described below) we determined a model recipe having three constraints. The three constraints in this example constrained each of H_D, H_B, and H_E to a linear combination of the other floating parameters. With the 3-constraint recipe just mentioned, reconstruction of the measured structure required fewer iterations (average 7.52) and the number of iterations required across the FEM wafer was far more consistent (ranging from 6 to 10 only). The measured (reconstructed) values for the parameters of interest (MCD_G, SWA_G and H_G) Side Wall Angle and Resist Height) were very similar to the original recipe with all parameters floating. We conclude that this model is an improvement on original recipe.

Recipe Optimization Process Using Parameter Advisor Tool

Figure 12A:
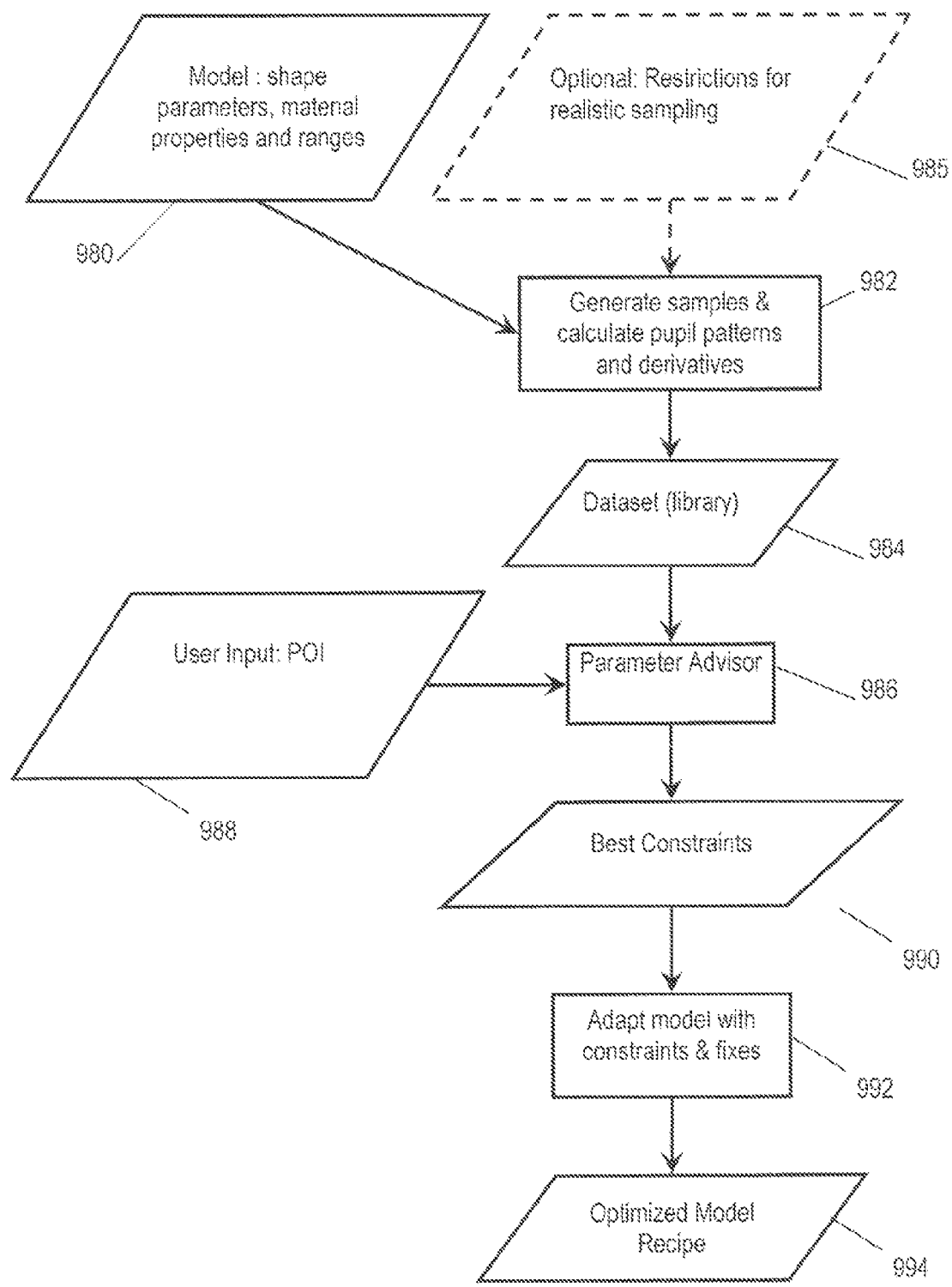

FIG. 12A, according to an embodiment of the present invention, illustrates the process of arriving at an optimized model recipe using the techniques and principles described above. The process can be substantially automated by suitable programming of a computer such as processing unit PU (FIG. 3 or 4). Steps of the process as are follows.

At 980 there is stored a full model of the target structure, with all parameters of shape and material properties, and also the nominal values and permitted ranges of deviation for each parameter. In step 982 a dataset 984 is generated by sampling the entire parameter space and calculating modeled diffraction signals. For example a 'Latin hyper cube sampling' can be applied over the entire multi-dimensional parameter range. The calculated diffraction signals can comprise pupil patterns represented by arrays of pixels. In addition to defining the intensity of each pixel in the pupil patterns, partial derivatives of each pixel intensity with respect to the various parameter, are also calculated to help in the model optimization process.

Optionally the data generation step 984 is performed with reference to a rule base 985 which defines certain restrictions for realistic sampling, based on known inter-relationships between parameters. This technique, which is the subject of our application, U.S. Patent Application No. 61/346,246, will be described in more detail below, with reference to FIGS. 15 and 16. The number of samples in the data set 984, and hence the computational burden and storage space required, can be reduced greatly by this technique.

Data set 984 forms a library that is used by a module 986 which forms a tool called the 'parameter advisor'. Module 986 determines the effect on the parameters of photon noise (in the scatterometer imaging), and the correlation between parameters. Certain parameters of interest (POI) are specified by user input 988. Parameter advisor module 986 determines if parameters in the model can be fixed, or that linear relations (or other generic constraints) between parameters can be introduced, without negatively influencing the parameters of interest. More description of the parameter advisor module is given below with reference to FIG. 12B.

A set of 'best' (recommended) constraints and fixes 990 is output. At 992 the model is adapted with reference to the constraints and fixes identified by the parameter advisor module 986 and an optimized model recipe 994 is output. Step 992 can be performed entirely automatically, or it can permit user intervention to confirm whether or not each of the fixes and/or generic constraints identified by the module 986 should be applied. In a particular embodiment, constraints are applied automatically, while user intervention is required before a parameter is fixed.

Parameter Advisor Implementation

FIG. 12B illustrates in more detail the working of Considering parameter advisor module 986 in more depth, it is noted that a good model recipe fulfills the following requirements:

parameters reconstructed from a measured diffraction signal using the model recipe are accurate;
calculation for the reconstruction process is fast; and
reconstruction is robust: no failures or 'unphysical' (unrealistic) results.

Having too many degrees of freedom leads to high variability in the reconstruction process due simply to noise. This component is referred to as 3σ (3-sigma) error, where σ represents standard deviation. Having too many degrees of freedom also leads to higher calculation times and larger storage for any library of pre-calculated pupil patterns. Using too few floating parameters results in a large error between model and reality. This latter error is a static, not noise-related, bias. The Root Mean Square Error (RMSE) quantifies the combined error of bias and noise. Seeking a recipe that corresponds to low RMSE is therefore a good way to find a model recipe that is balanced between bias and noise-sensitivity.

With this in mind, the basic principle of module 986 is to simulate the reconstruction processes of FIGS. 5 and/or 6 many times, trying different candidate model recipes and different samples, comparing the resulting RMSE values to identify a best model recipe from among the candidate model recipes. Specifically, a process 1000 is performed to generate candidate constraints, or rather candidate sets of constraints. 'Constraints' in this context includes both fixing of parameters and more generic constraints such as linear constraints discussed above. Each candidate set of constraints modifies the model 980 in a different way, to reduce degrees of freedom.

The candidate constraints can be generated entirely at random if desired. Optionally, as shown by the dashed arrow, this process can be guided by information in the dataset 984, particularly for example the partial derivatives of the diffraction signal pixels per parameter. Each set of candidate constraints (including for this purpose candidate fixes) forms a separate candidate model recipe with reduced degrees of freedom, and the set of these candidate model recipes are indicated at 1002. At 1004, a number of samples from dataset 984 are selected. A simulated reconstruction process 1006 is then executed many times. This simulated reconstruction process is the same process as described above with reference to FIGS. 5 and/or 6, but using the model diffraction signals of samples from dataset 984 in place of signals detected by illumination of real target structures in the scatterometer. Furthermore, the simulated reconstruction process is run for each sample with each of the candidate model recipes 1002 in place of the model 980 with all its degrees of freedom.

The output of the many reconstruction processes 1006 is effectively a set 1008 of simulated measurements, representing how the scatterometry and reconstruction process, using each particular candidate model recipe, would have reported the measurements of each sample. Using information of the parameters of interest POI, a process 1010 makes a comparison of the errors RMSE to evaluate the performance of the various candidate model recipes. From this comparison, the 'best' set of constraints and fixes is output at 990. This best set (which of course can include alternative best sets if preferred) can be used in step 992 to define the optimized model recipe 994 for use in actual measurements of actual target structures 30. For the mathematical implementation, parameters are denoted as $p_j$, p=1, 2, 3 . . . n, where n is the number of floating parameters. If the reconstructed values can be denoted as $\hat{p}_j$, the exact values as $p^*_j$ then the criterion to be applied is the "Expected RMSE", defined as:

$$RMSE = E\left[\sqrt{\sum_{j=1}^{n} (\hat{p}_j - p^*_j)^2}\right] \quad (6)$$

The expected RMSE can be calculated theoretically using the data set 984 as a reference collection, so no measurements of actual target structures are needed. The expectation is calculated based on a suitable probability density function of the scatterometer imaging noise. The RMSE is the quadratic sum of noise and bias:

$$RMSE = \sqrt{bias^2 + sigma^2} \quad (7)$$

The parameter advisor algorithm in one embodiment takes a candidate model recipe and evaluates the expected RMSE in the parameter or parameters of interest for a sample set of hypothetical gratings, randomly chosen from among the data set 984. The criterion to quantify the accuracy of a candidate model recipe can be based on whether, over the parameters of interest, RSME is better or worse than another candidate recipe. For example a criterion might be applied to see whether at the "expected RMSE" values are lower for at least 75% of the samples in the sample set, even if 25% are higher.

Just as FIGS. 5 and 6 illustrate alternative search strategies for fitting a best parameter set to an observed diffraction pattern, so the search for an optimized model recipe can be library-based, iterative (regression-based) or a hybrid of both. The set of candidate model recipes 1002 constitutes the 'library' for the purposes of this search. Once a 'coarse' model recipe optimization has been performed as illustrated in FIG. 12B, starting from a first set 1002 of candidate model recipes, A 'fine' recipe optimization can then be performed by repeating the process again, but starting from one or more of the candidate model recipes identified as 'best' in the coarse process. The fine recipe optimization can be library-based the same as the coarse process just described. Alternatively, if suitable mathematical connections can be established between the constraints and the RSME values for the parameters of interest, it can even be regression-based.

Parameter advisor module 986 cannot think of new parameters, it can only eliminate or restrict existing parameters. Therefore it is important to start with a model that has (more than) enough parameters. Referring to FIG. 13, according to an embodiment of the present invention, (a), for example, illustrates the simplest way of modeling a grating in a model is a single trapezoid. This will only ever be an approximation to the real physical shape of the feature, however. For some applications, using this simple approximation (a) will lead to inaccurate reconstructed parameters, or even unphysical outcomes. In those cases, a more accurate approximation can be used, for example with three trapezoids as shown at (b).

Reducing the number of degrees of freedom, rather than reducing the number of parameters as such, reduces calculation time and reduces noise sensitivity. Applying a constraint and associated dependency between a pair of parameters reduces the degrees of freedom by one, but the number of parameters remains the same. At the same time, the designer of the model 980 can be relatively 'generous' with the number of parameters and degrees of freedom initially, while the parameter advisor module will indicate where constraints can be applied to reduce the degrees of freedom in the applied model recipe 994. It will be appreciated that the recipe optimization process itself (FIGS. 12A, 12B) involves many additional degrees of freedom and multi-dimensionality, However, the recipe optimization process may be run only once, while the reconstruction process which actually applies the optimized recipe in reconstruction of measured target structures may be run many, many times. If the result of the optimization process is an efficient model recipe with fewer degrees of freedom than known recipes, the benefit will quickly outweigh the additional complication. In many commercial applications, it will be important to be able to repeat measurements every few seconds, even if the set-up time is much longer.

In conclusion, the parameter advisor module 986 can be seen as a tool enabling automatic or semi-automatic reduction in the number of degrees of freedom of a scatterometry reconstruction process. Degrees of freedom are reduced in particular by imposing or suggesting that certain parameters can be fixed to a certain value, or can be made dependent in a certain way on another parameter or combination of parameters. Many different forms of algorithm are possible, and the one set out above is only one example. To obtain the lowest possible number of degrees of freedom, the module 986 in this example uses the following ideas:

Concentrate on parameters of Interest (POI)
Concentrate on the range of interest
From ranges in the recipe
From knowledge of application process these ideas as explained below:

Concentrate on Parameters of Interest (POI):

More parameters generally mean a better match between model and reality. However, it is not necessarily true that all these parameters are of interest for the operator. The operator might prefer, say, to have parameter $p_5$ accurately measured (reconstructed), and might not care if parameter $p_3$ is accurately known or not. If a low RMSE is required for only the parameters of interest, it is likely that the number of degrees of freedom can be reduced further than in the case where that all parameters need to have low RMSE values.

The POI can also be defined as a combination of parameters. For instance, in FIG. 13(b), the total height can be a POI, defined as the sum of the heights of the three trapezoids.

Concentrate on the Range of Interest.

Every recipe contains a specification of range for each parameter. The module 986 calculates the expected RMSE for the POI for only those settings that are within these ranges. The smaller the ranges, the more degrees of freedom can be applied, without degrading precision.

A further improvement is based on knowledge of how certain parameters are inter-related in practice. This aspect, mentioned already and referred to as 'realistic sampling' is described in detail below.

As noted above, the constraints identified and applied here are not merely those which might be regarded as 'natural' constraints which are inherent in the definition of the model. For example, while the model can identify the total height of a stack of two layers as a parameter separate from the individual heights of two layers, these three parameters will only ever represent two degrees of freedom in the model. There is in that case no process of identifying additional constraints, of the form presented herein. In the example of FIG. 9, for example, it can clearly be seen that that constraint represented by the rising diagonal line is additional to, in a sense orthogonal to, the 'natural' constraint represented by the falling diagonal orientation of probability distribution function 902. Another example of such natural constraints would be an equality between the heights of two features, where the features are made in the same material layer and process steps. Another example of such natural constraints would be an equality between refractive indices of two features, which are made of the same material (assuming the material shows 'normal' behavior).

Any new implementation of the parameter advisor is likely to be based largely on simulations of the lithographic process for different models. This approach assumes that the model is accurate enough to describe reality, but this assumption can not be verified with the generated data. Therefore, as data becomes available it can be used for the qualification of the model. Example source of information for use in this qualification process could include:
  correlation with a reference metrology tool
  using residues of fitted measurements (typically FEM measurements)
  verification of the parameter reduction as suggested by the tool via reconstruction Realistic Sampling With regard to the second modification of the measurement processes of FIG. 6 mentioned above, we introduce the concept of 'realistic' versus 'unrealistic' candidate structures. which is described in our co-pending patent application U.S. Patent Application No. 61/346,246.

FIG. 14, according to an embodiment of the present invention, shows an inter-relationship between critical dimension CD and SWA in a schematic way, for the simple target structure shown in FIG. 7. Three different shapes for feature 702 are shown at (a), (b) and (c). In (a) the parameters H1, MCD and SWA (not labeled in FIG. 14) are all at low values. In (b) the same three parameters are all at high values. In (c) the parameter H is high, but MCD and SWA are both low. In the case where estimated parameter sets are generated by randomizing the parameters independently of one another, all three examples (a), (b) and (c) are equally likely to occur. In a real target 30, however, the processes of exposure and etching are such that the situation shown at (c) is simply unrealistic. Either it cannot occur or it will occur with very low probability. When such situations are included as calculated samples within the libraries of FIG. 6 or FIG. 12, or are permitted as estimates within the iterative process of FIG. 5, many estimates of the samples considered for matching will correspond to shapes that cannot appear, or are unlikely to appear, in the lithography process being measured.

There is no one-to-one relation between target shapes and diffraction patterns, and so the same pupil pattern or other diffraction pattern can be generated with different shapes. Allowing these 'unrealistic' shapes to be represented in the library might lead to wrong results in the matching process that provides the measurement results of the scatterometry tool. In addition, extra candidates in the library means extra searching time and larger library size.

In order to improve the quality and reliability of the measurements reported in step 514 or 614, and/or in the model recipe optimization, the inventors propose in effect to apply filters in the generation of estimated parameters during iterative modeling (step 504/512) and/or in library generation (step 604/608, 982). Given known parameters of the lithographic process (for example the focus range, dose range and illumination settings) a collection of restrictions are created. These restrictions, which can for example be based on linear combinations of the parameters of the model, force the samples to be generated in an "area of interest" that matches with the expected results of our litho process.

FIG. 15, according to an embodiment of the present invention, illustrates how relationships between the three parameters H1, MCD and SWA, that represent the trapezoidal cross-section of the feature 702, can be used to restrict the combinations of parameters considered for calculation of diffraction patterns. The graph at (a) shows a range of values that can be taken by the side wall angle SWA (vertical axis) and the critical dimension MCD (horizontal axis), in an example target. The graph at (b) shows the resist height H1 (vertical axis) against the same range of SWA (horizontal axis). A location on graph (a) therefore represents a particular combination of SWA, MCD parameter values. It may be noted that SWA can exceed 90 degrees in practice, where the shape is re-entrant. The trapezoidal feature 702 would appear inverted in such a case.

It is also an option to model the shape of the feature with more complexity for example as a stack of trapezoids where an etching process can yield more complex profiles. by a bottom trapezoid and a top trapezoid, each having its own height, width, and SWA. Clearly sub-dividing the feature into a stack of features with their own parameters increases the multi-dimensional nature of the problem. Exploiting inter-relationships between these parameters to restrict the realistic or likely sets of parameters in the manner described herein is therefore an attractive tool for controlling the computational demands, as the structures and processes, and hence their models, get more complex. In the case of a stack of features, the total height of the stack is a parameter that has a known inter-relationship with the heights of the components within the stack. Candidate structures in which the heights of the components do not add up to the total height of the stack can be deemed unrealistic. The components can be separate materials, or simply separate components modeling a single complex feature.

While considering stacked features, or features modeled as stacks, it can be mentioned that the techniques described here are equally applicable to the measurement of 'featureless' structures, such as multi-layer thin film structures. In such cases, it may be debatable whether the observed and modeled pupil pattern or spectrum is strictly a 'diffraction pattern', because it contains only zero order components. A ring-like pattern is observed in samples where a significant a large center-to-edge difference is present in a layer, caused by interference between rays reflected at the interfaces between the layers of the structure. Nevertheless, the scatterometers described are perfectly adapted to observing such structures and for measuring parameters of them by comparison with model diffraction patterns, just as described for the gratings. For the avoidance of doubt, the expressions 'diffraction pattern' and 'modeled diffraction pattern' are used herein to encompass such zero-order patterns without further distinction.

Small squares on each graph represent randomized samples that could be generated in a known reconstruction process. The larger squares represent the combinations of SWA, MCD parameters observed in real targets. As can be observed, the real samples are distributed in a restricted area, having a characteristic shape, which is process dependent. In the modified process steps disclosed herein, the parameter sets (samples in parameter space) generated in steps 504/512, 604/608 and 982 are restricted by a first rule represented by the curve R1. Parameter sets in which the SWA, MCD values lie outside this curve are excluded from consideration as candidates for matching the observed diffraction pattern. Two of the excluded samples are labeled X in the diagram. Similarly, in graph (b), a different parameter distribution is characteristic of the pairs H1, SWA that can be observed in the real target samples. A rule represented by curve R2 excludes samples such as X which fall outside the curve.

By applying the rules R1, R2, unrealistic parameter sets such as the one corresponding to FIG. 14(c) will be excluded from consideration as candidates in the process of reconstructing the observed target shape. The restrictions or rules can be applied in different ways to achieve the same effect. The estimated parameter sets can be generated randomly as before, and then tested against the rules. Sets which violate one or more of the rules are discarded and not used to calculate a sample pattern for matching or for storage in the library. Alternatively, the estimated parameter sets can be generated by a modified randomization process that has the restrictions built in. The expression of the rules is a matter of choice. Simple mathematical relations (linear or polynomial equations) between the parameters in each pair can be defined. Alternatively the parameter space (i.e., the area of graph (a), (b) etc) can be divided into an array of blocks and an array of flags stored to indicate whether a particular block satisfies the rule. If the array is three-dimensional, both rules R1 and R2 can be implemented in the same array.

Clearly to define a suitable set of rules requires some knowledge of the particular distributions of realistic samples in the parameter space. This knowledge can be obtained empirically, by measurement of many samples. Alternatively or in addition, it can be derived by simulation of the exposure or other lithographic process steps, in which the inter-relationships that give rise to the particular distributions are represented. The samples represented by the large squares, which illustrate the distribution, can therefore be considered as actual measured samples, or as samples simulated by modeling the lithographic process.

The inter-relationships between SWA, H1, and MCD are by no means the only ones which can be identified and used to impose restrictions in the generation of samples parameter sets, for instance the relation between the thicknesses of different deposited layers. Relationships between parameters may exist or not depending on the process. One example of this is occurs in the non-random FEM (focus-exposure matrix) process, which will be known to the skilled reader and is special used for calibration and characterization of lithographic processes, rather than for production of devices on 'real' substrates.

Figure 16:
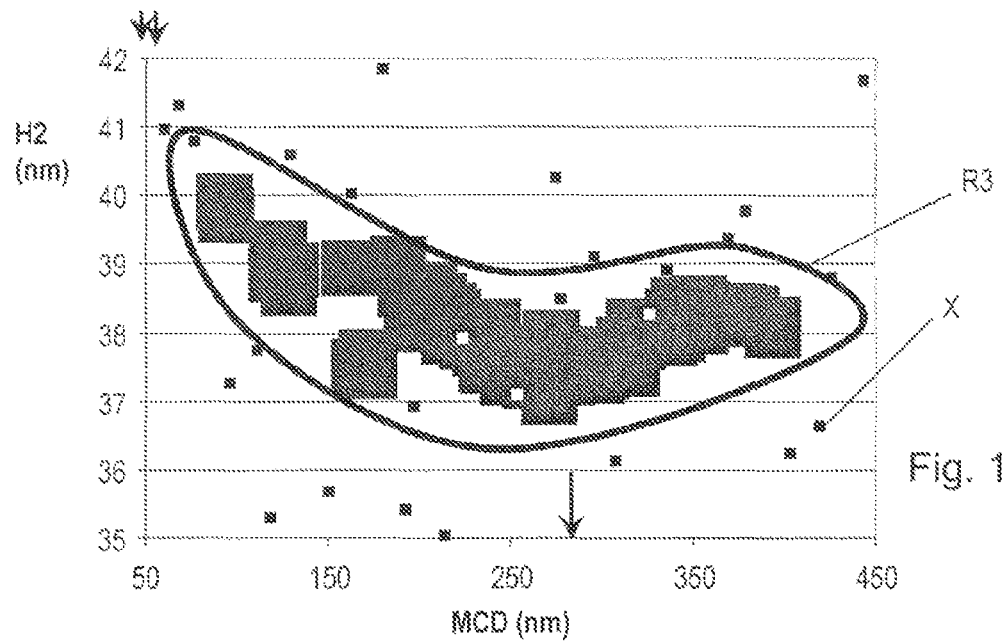
Figure 16:
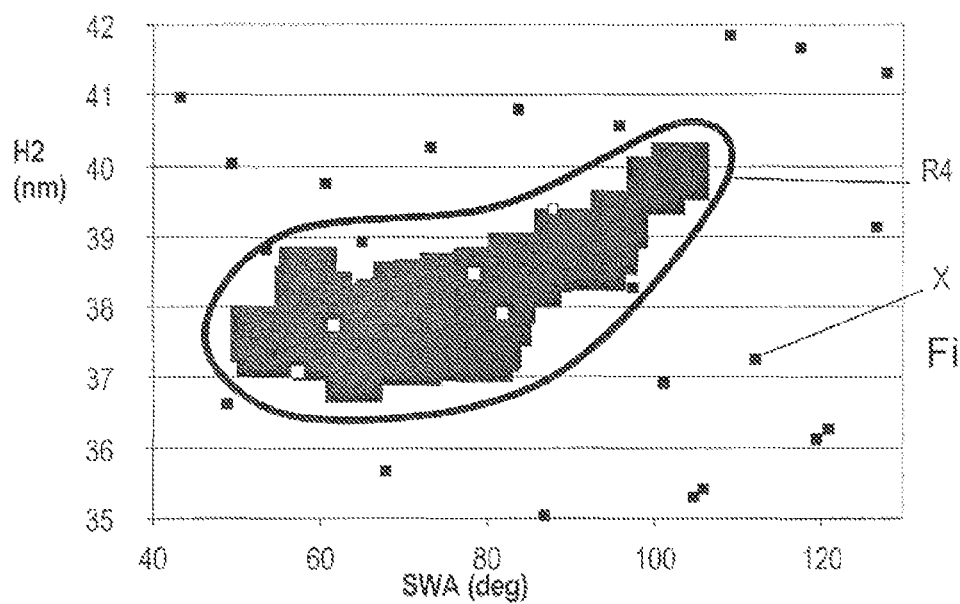

FIG. 16, according to an embodiment of the present invention, (a) shows the relationship also between the thickness H2 of the anti-reflective (BARC) layer 706 (vertical axis) and critical dimension MCD (horizontal axis), when the grating is exposed using a particular non-random FEM (focus-exposure matrix) process. A rule represented by curve R3 can be applied to exclude samples X that are not in the region of the graph occupied by real target samples. Similarly, with reference to FIG. 10(b), a rule represented by curve R4 can be used to exclude unrealistic combinations of BARC height (H2) and side wall angle SWA. Another example of parameters which show inter-relationships might be different refractive index components for a certain material within the modeled structure. In many cases, the refractive index of a material forming a layer or feature 702 will be regarded as constant across the entire target. Some materials, however, can be subject to variations in refractive index and/or extinction coefficient between different parts of the substrate, or between different substrates, and so refractive index becomes one of the parameters to be estimated in the process of FIG. 5 or 6. In a case where the material in question is briefringent, refractive indices and extinction coefficients for the 'ordinary ray' and the 'extraordinary ray' can be four separate parameters at each point in the material. A material commonly used as a 'hard mask' in lithographic processes is amorphous Carbon, which turns out to have very complex optical properties. These optical properties, including birefringence, are variable across a substrate, and so are floating parameters, not fixed. In the example of amorphous carbon—we need to model these four parameters independently for each illumination wavelength, because the relations between them are to date not fully defined. This is in contrast, for example, to amorphous silicon. For this reason, the measurement of structures which incorporate such layers is extremely challenging using known techniques. For every floating parameter, in principle the size of the library or iterative search problem is multiplied by another dimension.

The inventors have recognized that there exist at least some known relationships between these parameters, and, for a given parameter, between different wavelengths. These relationships can be exploited, in accordance with the present invention, to reduce the computational burden substantially. One known relationship is in the refractive index n for the different wavelengths used in the scatterometer. It is known that the following relationship holds in amorphous carbon $$n@425\ nm < n@450\ nm < \ldots < n@700\ nm \qquad (8)$$

The same applies for the extinction coefficient k, in both ordinary and extraordinary components. Accordingly, an embodiment of the invention applies one or more restrictions (rules) in the generation of samples, so that samples violating the above relationships are not generated, or are not considered with the same weight as other samples.

Also in amorphous carbon, there exist relations between the ordinary and extraordinary refractive indices per wavelength, such that the ordinary refractive index at a given wavelength is generally a certain factor times the extraordinary (the factor depends on the wavelength). These relations are process dependent. Also there exist relations between n and k components. These relations are given by Kramers-Kronig relations. While the values of n and k are process dependent, their Kramers-Kronig relations are not, since the origin of these relations is that both n and k are, respectively, the real and imaginary part of the same magnitude, directly related with the permittivity-. However, these relations cannot be accurately determined in all cases, since the determination of k requires the knowledge of n at all frequencies from 0 to infinity. In any case, so long as some restriction or likelihood value can be applied to samples, using an inter-relationship between parameters, however broad it may be, use of the novel technique greatly reduces the scale of the computation and storage required to reconstruct the observed structure. By applying appropriate restrictions or rules in the same manner as illustrated in FIGS. 9 and 10, the number of combinations (parameter sets) to be considered as candidates for matching with the observed diffraction pattern is greatly reduced, and/or unrealistic parameter sets are excluded.

In conclusion, the processing unit PU described above with reference to the scatterometers of FIGS. 3 and 4 can be configured to reconstruct an approximate structure of an object using methods such as those described with reference to FIGS. 5 to 16.

An optimized recipe using generic constraints such as linear constraints can reduce the number of degrees of freedom in the model, without sacrificing accuracy. A 'realistic sampling' of the parameter space, as described above, can also be used at one or more points in the process. Both of these techniques make such a metrology process more accurate, whether it is used for building a library (FIG. 6) or as part of an iterative matching process (FIG. 5). Advice obtained for improving the set-up of the lithographic process will be more reliable, and can be available in near-real time, even for complex structures. With or without realistic sampling, reducing the number of degrees of freedom will be expected to reduce the minimum number of entries required for a library to achieve a certain measurement standard, thus making the libraries smaller and the computation faster. In addition, to adapt the existing hardware and software to implement the modified process is relatively easy. The rules or filters can be implemented in a separate hardware or software module.

Further embodiments and considerations for implementing the realistic sampling option are described in our co-pending patent application U.S. Patent Application No. 61/346,246.

The same processing unit PU can include the entire process of FIGS. 5 and/or 6 and 12, or different processes and sub-processes can be assigned to different processing units (not shown). The processing unit PU can operated with a computer program product containing one or more sequences of machine-readable instructions for determining an approximate structure of an object on a substrate, the instructions being adapted to cause one or more processors in the PU to perform the methods described herein. In such an arrangement, a software module running on the processing unit PU can receive the diffraction signal and the electromagnetic scattering property from the other components of the scatterometer.

The computer program product containing instructions implementing the process with realistic sampling can be supplied for modifying the operation of an existing hardware system. Another product can include simply the optimized recipe appropriate for measuring a particular type of target structure in a given lithographic process. Another product can contain the stored library of parameter sets and their associated modeled diffraction patterns, spectra or the like, for use by the parameter advisor process.

Although specific reference can be made in this text to the use of inspection methods and apparatus in the manufacture of ICs, it should be understood that the inspection methods and apparatus described herein can have other applications, such as the manufacture of integrated optical systems, guidance and detection patterns for magnetic domain memories, flat-panel displays, reticles, liquid-crystal displays (LCDs), thin film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track (a tool that typically applies a layer of resist to a substrate and develops the exposed resist), a metrology tool, and/or an inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

Although specific reference can have been made above to the use of embodiments of the invention in the context of optical lithography, it will be appreciated that the invention can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, can refer to any one or combination of various types of optical components, including refractive, reflective, magnetic, electromagnetic, and electrostatic optical components.

The term "electromagnetic" encompasses electric and magnetic.

The term "electromagnetic scattering properties" encompasses reflection and transmission coefficients and scatterometry measurement parameters including spectra (such as intensity as a function of wavelength), diffraction patterns (intensity as a function of position/angle) and the relative intensity of transverse magnetic- and transverse electric-polarized light and/or the phase difference between the transverse magnetic- and transverse electric-polarized light. Diffraction patterns themselves can be calculated for example using reflection coefficients.

Thus, although embodiments of the present invention are described in relation to reflective scattering, the invention is also applicable to transmissive scattering.

While specific embodiments of the invention have been described above, it will be appreciated that the invention can be practiced otherwise than as described. For example, the invention can take the form of a computer program containing one or more sequences of machine-readable instructions describing a method as disclosed above, or a data storage medium (e.g., semiconductor memory, magnetic or optical disk) having such a computer program stored therein.

For example, software functionalities of a computer system involve programming, including executable codes, can be used to implement the above described inspection methods. The software code can be executable by a general-purpose computer. In operation, the code and possibly the associated data records can be stored within a general-purpose computer platform. At other times, however, the software can be stored at other locations and/or transported for loading into an appropriate general-purpose computer system. Hence, the embodiments discussed above involve one or more software products in the form of one or more modules of code carried by at least one machine-readable medium. Execution of such codes by a processor of the computer system enables the platform to implement the functions in essentially the manner performed in the embodiments discussed and illustrated herein.

As used herein, terms such as computer or machine "readable medium" refer to any medium that participates in providing instructions to a processor for execution. Such a medium can take many forms, including but not limited to, non-volatile media, volatile media, and transmission media. Non-volatile media include, for example, optical or magnetic disks, such as any of the storage devices in any computer(s) operating as discussed above. Volatile media include dynamic memory, such as main memory of a computer system. Physical transmission media include coaxial cables, copper wire, and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read or send programming codes and/or data. Many of these forms of computer readable media can be involved in carrying one or more sequences of one or more instructions to a processor for execution.

It is to be appreciated that the Detailed Description section, and not the Summary and Abstract sections, is intended to be used to interpret the claims. The Summary and Abstract sections can set forth one or more but not all exemplary embodiments of the present invention as contemplated by the inventor(s), and thus, are not intended to limit the present invention and the appended claims in any way.

The present invention has been described above with the aid of functional building storing blocks illustrating the implementation of specified functions and relationships thereof. The boundaries of these functional building storing blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method of determining one or more geometric properties of a structure based on radiation received from the structure, the method comprising:
    receiving a substrate having the structure patterned upon it;
    generating a signal, at a detector, based on receiving a beam of radiation arising from interaction of radiation with the structure under illumination;
    generating a reference collection of model structures using a reference model recipe, wherein the reference model recipe has more degrees of freedom than are desired for a model recipe;
    calculating a reference collection of model signals, by modeling the interaction of the radiation with each of the model structures in the reference collection;
    generating, using one or more processors, a plurality of different candidate model recipes, each candidate model recipe comprising a set of one or more constraints, each constraint reducing a number of degrees of freedom in the given candidate model recipe by defining a relationship among a subset of variable parameters of the given candidate model recipe, wherein each constraint is applied such that the associated subset of variable parameters are constrained to vary together in accordance with the associated constraint;
    calculating one or more model signals using a model structure generated with each of the candidate model recipes and comparing the one or more model signals to the reference collection of model signals from the reference collection to identify a best matching model signal for each of the candidate model recipes;
    determining, using the one or more processors, one or more measurement parameters for each combination of candidate model recipes and model signals from the reference collection based on the model structure corresponding to the best matching model signal for each of the candidate model recipes;
    selecting, from the candidate model recipes, a best model recipe by comparing the one or more measurement parameters from each combination of candidate model recipes and model signals from the reference collection with known parameter values of the model structures in the reference collection;
    calculating one or more additional model signals using a model structure generated with the best model recipe;
    comparing the one or more additional model signals to the signal generating by the detector to identify a best matching model signal for the structure under illumination;
    determining one or more measurement parameters of the structure under illumination corresponding to the best matching model signal for the structure under illumination;
    reporting, using the one or more processors, the one or more measurement parameters corresponding to the one or more geometric properties of the structure under illumination; and
    adjusting one or more parameters of an exposure performed on a second substrate received by a lithographic apparatus based on the one or more measurement parameters.

2. The method of claim 1, wherein the subset comprises more than two of the variable parameters.

3. The method of claim 1, wherein the constraint defines a linear relationship between the variable parameters in the subset.

4. The method of claim 1, wherein at least one parameter within the subset is designated a dependent parameter in accordance with the constraint and a dependency relation is defined between each dependent parameter and one or more of the other parameters in the subset, the dependency relation being used to calculate the dependent parameter from the other parameter or parameters, prior to calculation of the model signal.

5. The method of claim 1, wherein a subset of one or more of the variable parameters are designated as parameters of interest for the method of measurement, and wherein in the selecting the measured parameter values compared are exclusively or predominantly those of the designated parameters of interest.

6. The method of claim 1, wherein the providing a reference collection comprises providing a reference collection of model structures distributed in a parameter space defined by the variable parameters and the degrees of freedom of the mathematical model, and wherein the distribution of the candidate structures is restricted by reference to an inter-relationship between at least two of the degrees of freedom, by which certain combinations of values of the inter-related parameters are more likely than others to occur in a structure to be measured.

7. The method of claim 1, wherein each candidate model recipe includes given dependencies between certain of the variable parameters, and wherein the set of one or more constraints are separate from the given dependencies.

8. The method of claim 1, wherein the generating a reference collection of model structures and the calculating a reference collection of model signals are performed to create a library of pre-stored diffraction signals.

9. The method of claim 1, wherein the generating a reference collection of model structures and the calculating a reference collection of model signals are performed in an iterative process.

10. The method of claim 1, wherein the generating a reference collection of model structures and the calculating a reference collection of model signals are performed to create a library of pre-stored diffraction signals and subsequently the generating a reference collection of model structures and the calculating a reference collection of model signals are performed to generate further model structures and model signals as part of an iterative process.

11. The method of claim 1, wherein at least one of the candidate model recipes generated has a further subset of parameters designated as fixed parameters.

12. The method of claim 11, wherein different candidate model recipes have different subsets of parameters designated as fixed parameters.

13. An inspection apparatus integrated into a lithographic apparatus or a lithocell, the inspection apparatus being configured to determine one or more geometric properties of a structure on a substrate based on radiation received from the structure, the inspection apparatus comprising:
   an illumination system configured to illuminate the structure on the substrate with one or more beams of radiation;
   a detection system configured to detect a signal arising from interaction between the radiation and the structure; and
   a processor configured to:
      generate a reference collection of model structures using a reference model recipe, wherein the reference model recipe has more degrees of freedom than are desired for a model recipe;
      calculate a reference collection of model signals, by modeling the interaction of the radiation with each of the model structures in the reference collection;
      generate a plurality of different candidate model recipes, each candidate model recipe comprising a set of one or more constraints, each constraint reducing a number of degrees of freedom in the given candidate model recipe by defining a relationship among a subset of variable parameters of the given candidate model recipe, wherein each constraint is applied such that the associated subset of variable parameters are constrained to vary together in accordance with the associated constraint,
      calculate one or more model signals using a model structure generated with each of the candidate model recipes and comparing the one or more model signals to the reference collection of model signals from the reference collection to identify a best matching model signal for each of the candidate model recipes;
      determine, using the one or more processors, one or more measurement parameters for each combination of candidate model recipes and model signals from the reference collection based on the model structure corresponding to the best matching model signal for each of the candidate model recipes;
      select, from the candidate model recipes, a best model recipe by comparing the one or more measurement parameters from each combination of candidate model recipes and model signals from the reference collection with known parameter values of the model structures in the reference collection;
      calculate one or more additional model signals using a model structure generated with the best model recipe,
      comparing the one or more additional model signals to the signal detected by the detection system to identify a best matching model signal for the structure under illumination,
      determining one or more measurement parameters corresponding to the one or more geometric properties of the structure under illumination corresponding to the best matching model signal for the structure under illumination, and
      adjust one or more parameters of an exposure performed on a second substrate within the lithographic apparatus or the lithocell based on the one or more measurement parameters.

14. A non-transitory computer-readable medium containing one or more sequences of machine-readable instructions for determining one or more geometric properties of a structure on a substrate based on radiation received from the structure, the instructions being adapted to cause one or more processors to:
   receive a signal arising from interaction of radiation with the structure on the substrate under illumination;
   generate a reference collection of model structures using a reference model recipe, wherein the reference model recipe has more degrees of freedom than are desired for a model recipe;
   calculate a reference collection of model signals, by modeling the interaction of the radiation with each of the model structures in the reference collection;
   generate a plurality of different candidate model recipes, each candidate model recipe comprising a set of one or more constraints, each constraint reducing a number of degrees of freedom in the given candidate model recipe by defining a relationship among a subset of variable parameters of the given candidate model recipe, wherein each constraint is applied such that the associated subset of variable parameters are constrained to vary together in accordance with the associated constraint;
   calculate one or more model signals using a model structure generated with each of the candidate model recipes and comparing the one or more model signals to the reference collection of model signals from the reference collection to identify a best matching model signal for each of the candidate model recipes;
   determine, using the one or more processors, one or more measurement parameters for each combination of candidate model recipes and model signals from the reference collection based on the model structure corresponding to the best matching model signal for each of the candidate model recipes;
   select, from the candidate model recipes, a best model recipe by comparing the one or more measurement parameters from each combination of candidate model recipes and model signals from the reference collection with known parameter values of the model structures in the reference collection;

calculate one or more additional model signals using a model structure generated with the best model recipe;

comparing the one or more additional model signals to the signal associated with the structure under illumination to identify a best matching model signal for the structure under illumination;

determining one or more measurement parameters corresponding to the one or more geometric properties of the structure under illumination corresponding to the best matching model signal for the structure under illumination, and adjusting one or more parameters of an exposure performed on a second substrate within a lithographic apparatus based on the one or more measurement parameters.

15. A method of determining one or more geometric properties of a structure on a substrate based on radiation received from the structure, the method comprising:

receiving a substrate having the structure patterned upon it;

defining a reference model recipe of the structure, in which shape and material properties are represented by a plurality of parameters which are variable with a plurality of degrees of freedom;

generate a reference collection of model structures using the reference model recipe;

calculate a reference collection of model signals, by modeling the interaction of the radiation with each of the model structures in the reference collection;

defining a plurality of different candidate model recipes by designating which of the parameters will be treated as fixed parameters and which of the parameters will be treated as variable parameters, each candidate model recipe comprising a set of one or more constraints, each constraint of a given candidate model recipe reducing a number of degrees of freedom in the given candidate model recipe by defining a relationship among a subset of the variable parameters of the given candidate model recipe, wherein each constraint is applied such that the associated subset of the variable parameters are constrained to vary together in accordance with the associated constraint;

illuminating the structure with one or more beams of radiation and receiving, at a detector, a beam of radiation arising from interaction between the one or more beams of radiation and the structure, the detector being configured to generate a signal based on the received beam of radiation;

calculating one or more model signals using a model structure generated with each of the candidate model recipes and comparing the one or more model signals to the reference collection of model signals from the reference collection to identify a best matching model signal for each of the candidate model recipes;

determining, using the one or more processors, one or more measurement parameters for each combination of candidate model recipes and model signals from the reference collection based on the model structure corresponding to the best matching model signal for each of the candidate model recipes;

selecting, from the candidate model recipes, a best model recipe by comparing the one or more measurement parameters from each combination of candidate model recipes and model signals from the reference collection with known parameter values of the model structures in the reference collection;

calculating one or more additional model signals using a model structure generated with the best model recipe;

comparing the one or more additional model signals to the signal generated by the detector to identify a best matching model signal for the structure under illumination;

determining one or more measurement parameters of the structure under illumination corresponding to the best matching model signal for the structure under illumination;

reporting, using the one or more processors, the one or more measurement parameters corresponding to the one or more geometric properties of the structure under illumination; and adjusting one or more parameters of an exposure performed on a second substrate received by a lithographic apparatus based on the one or more measurement parameters.

16. The method of claim 1, wherein each candidate model recipe comprises a different set of one or more constraints.

17. The inspection apparatus of claim 13, wherein each candidate model recipe comprises a different set of one or more constraints.

* * * * *